United States Patent
Chou et al.

(10) Patent No.: US 12,046,475 B2
(45) Date of Patent: Jul. 23, 2024

(54) SURFACE OXIDATION CONTROL OF METAL GATES USING CAPPING LAYER

(71) Applicant: Taiwan Semiconductor Manufacturing Co., Ltd., Hsinchu (TW)

(72) Inventors: Pei-Yu Chou, Hsinchu (TW); Tze-Liang Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 82 days.

(21) Appl. No.: 17/191,105

(22) Filed: Mar. 3, 2021

(65) Prior Publication Data

US 2022/0223422 A1    Jul. 14, 2022

Related U.S. Application Data

(60) Provisional application No. 63/137,201, filed on Jan. 14, 2021.

(51) Int. Cl.
*H01L 21/28* (2006.01)
*H01L 21/311* (2006.01)
(Continued)

(52) U.S. Cl.
CPC .. *H01L 21/28247* (2013.01); *H01L 21/76802* (2013.01); *H01L 21/76816* (2013.01);
(Continued)

(58) Field of Classification Search
CPC ......... H01L 29/66545; H01L 29/66606; H01L 29/66871
See application file for complete search history.

(56) References Cited

U.S. PATENT DOCUMENTS

| 10,679,589 B2 | 6/2020 | Ohashi |
| 10,868,183 B2 | 12/2020 | More et al. |

(Continued)

FOREIGN PATENT DOCUMENTS

| KR | 20180069673 A | 6/2018 |
| KR | 20200002570 A | 1/2020 |

(Continued)

OTHER PUBLICATIONS

Wikipedia, "plasma etching," https://de.wikipedia.org/w/index.php?title=Plasma%C3%A4tzen&oldid=142929334, Dec. 22, 2022, 12 pages.

*Primary Examiner* — Monica D Harrison
*Assistant Examiner* — Andre C Stevenson
(74) *Attorney, Agent, or Firm* — Slater Matsil, LLP

(57) ABSTRACT

A method includes forming a dummy gate stack on a semiconductor fin, forming gate spacers on sidewalls of the dummy gate stack, forming a first inter-layer dielectric, with the gate spacers and the dummy gate stack being in the first inter-layer dielectric, removing the dummy gate stack to form a trench between the gate spacers, forming a replacement gate stack in the trench, and depositing a dielectric capping layer. A bottom surface of the dielectric capping layer contacts a first top surface of the replacement gate stack and a second top surface of the first inter-layer dielectric. A second inter-layer dielectric is deposited over the dielectric capping layer. A source/drain contact plug is formed and extends into the second inter-layer dielectric, the dielectric capping layer, and the first inter-layer dielectric.

20 Claims, 23 Drawing Sheets

(51) Int. Cl.
  *H01L 21/768* (2006.01)
  *H01L 27/088* (2006.01)
  *H01L 29/40* (2006.01)
  *H01L 29/417* (2006.01)
  *H01L 29/66* (2006.01)

(52) U.S. Cl.
  CPC ...... *H01L 29/401* (2013.01); *H01L 29/66454* (2013.01); *H01L 29/66795* (2013.01); *H01L 21/31116* (2013.01); *H01L 21/76832* (2013.01); *H01L 21/76834* (2013.01); *H01L 27/0886* (2013.01); *H01L 29/41791* (2013.01)

(56) References Cited

U.S. PATENT DOCUMENTS

| | | | |
|---|---|---|---|
| 11,088,025 B2 | 8/2021 | Hsieh et al. | |
| 11,183,580 B2 | 11/2021 | Chang et al. | |
| 11,282,938 B2 | 3/2022 | Tang et al. | |
| 11,355,339 B2 | 6/2022 | Kao et al. | |
| 11,380,774 B2 | 7/2022 | Lim et al. | |
| 2015/0108589 A1* | 4/2015 | Cheng | H01L 29/66545 257/411 |
| 2017/0084721 A1* | 3/2017 | Hung | H01L 21/76897 |
| 2020/0013678 A1* | 1/2020 | Gu | H01L 21/32133 |
| 2020/0035549 A1 | 1/2020 | Wu | |
| 2020/0035605 A1 | 1/2020 | Tsai et al. | |
| 2020/0388693 A1* | 12/2020 | Gu | H01L 21/02351 |
| 2020/0411415 A1 | 12/2020 | Wu et al. | |

FOREIGN PATENT DOCUMENTS

| | | |
|---|---|---|
| KR | 20200037106 A | 4/2020 |
| TW | 20180131346 A | 12/2018 |
| TW | 201923917 A | 6/2019 |
| TW | 202025312 A | 7/2020 |
| TW | 202044346 A | 12/2020 |

* cited by examiner

SURFACE OXIDATION CONTROL OF METAL GATES USING CAPPING LAYER

PRIORITY CLAIM AND CROSS-REFERENCE

This application claims the benefit of the U.S. Provisional Application No. 63/137,201, filed Jan. 14, 2021, and entitled "Method of Surface Oxidation Control by nitride Capping Structure," which application is hereby incorporated herein by reference.

BACKGROUND

Metal-Oxide-Semiconductor (MOS) devices are basic building elements in integrated circuits. Recent development of the MOS devices includes forming replacement gates, which include high-k gate dielectrics and metal gate electrodes over the high-k gate dielectrics. The formation of a replacement gate typically involves depositing a high-k gate dielectric layer and metal layers over the high-k gate dielectric layer, and then performing Chemical Mechanical Polish (CMP) to remove excess portions of the high-k gate dielectric layer and the metal layers. The remaining portions of the metal layers form the metal gates. The metal gates may be recessed to form recesses between neighboring gate spacers, followed by forming self-aligned dielectric hard masks in the trenches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
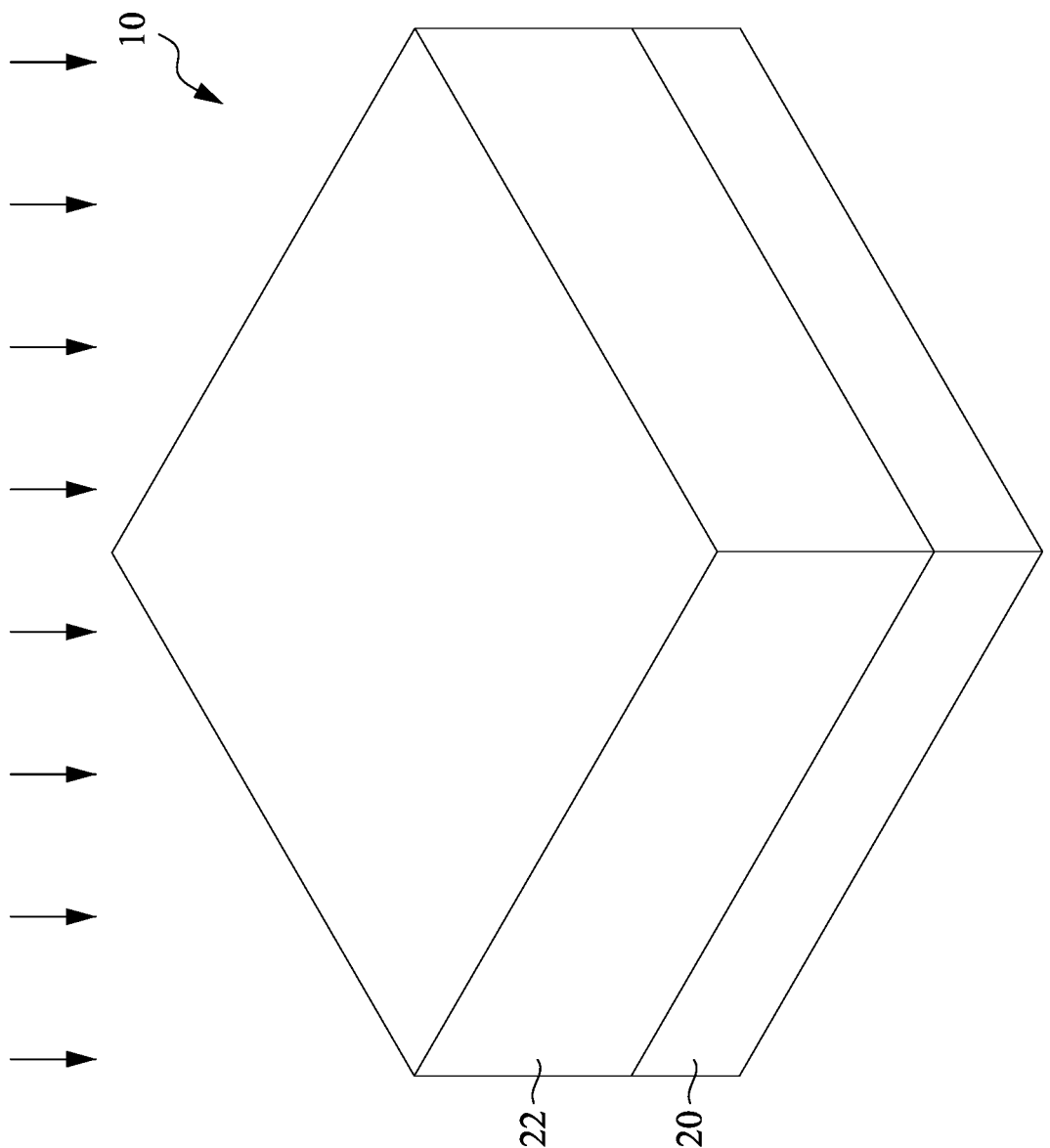
FIGS. 1-6, 7A, 7B, and 8-19 illustrate the perspective views and cross-sectional views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Fin Field-Effect Transistor (FinFET) and the method of forming the same are provided. In accordance with some embodiments of the present disclosure, before the formation of an oxygen-containing inter-layer dielectric, a dielectric capping layer, which is free from oxygen and has the capability of blocking oxygen diffusion, is deposited over and contacting metal gates. The inter-layer dielectric is then deposited on the dielectric capping layer. The dielectric capping layer has the ability of blocking oxygen diffusion, so that the underlying metal gate is not oxidized in subsequent annealing processes. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 22:
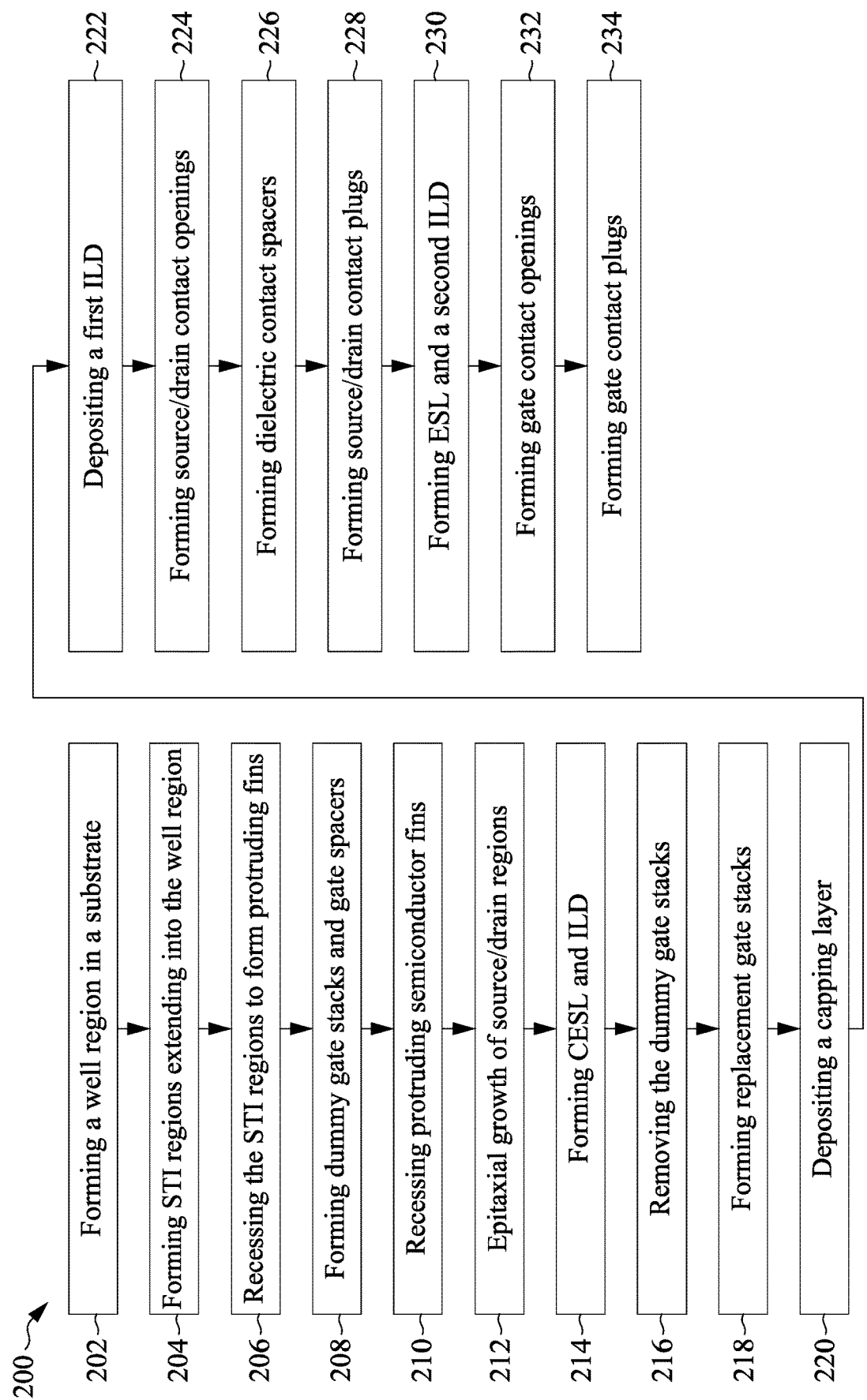
FIG. 22 illustrates a process flow for forming FinFETs in accordance with some embodiments.

FIGS. 1-6, 7A, 7B, and 8-19 illustrate the cross-sectional views and perspective views of intermediate stages in the formation of Fin Field-Effect Transistors (FinFETs) in accordance with some embodiments of the present disclosure. The processes shown in these figures are also reflected schematically in the process flow 200 as shown in FIG. 22.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon substrate or a glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 202 in the process flow 200 as shown in FIG. 22. In accordance with some embodiments of the present disclosure, well region 22 is an n-type well region formed through implanting an n-type impurity, which may be phosphorus, arsenic, antimony, or the like, into substrate 20. In accordance with other embodiments of the present disclosure, well region 22 is a p-type well region formed through implanting a p-type impurity, which may be boron, indium, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
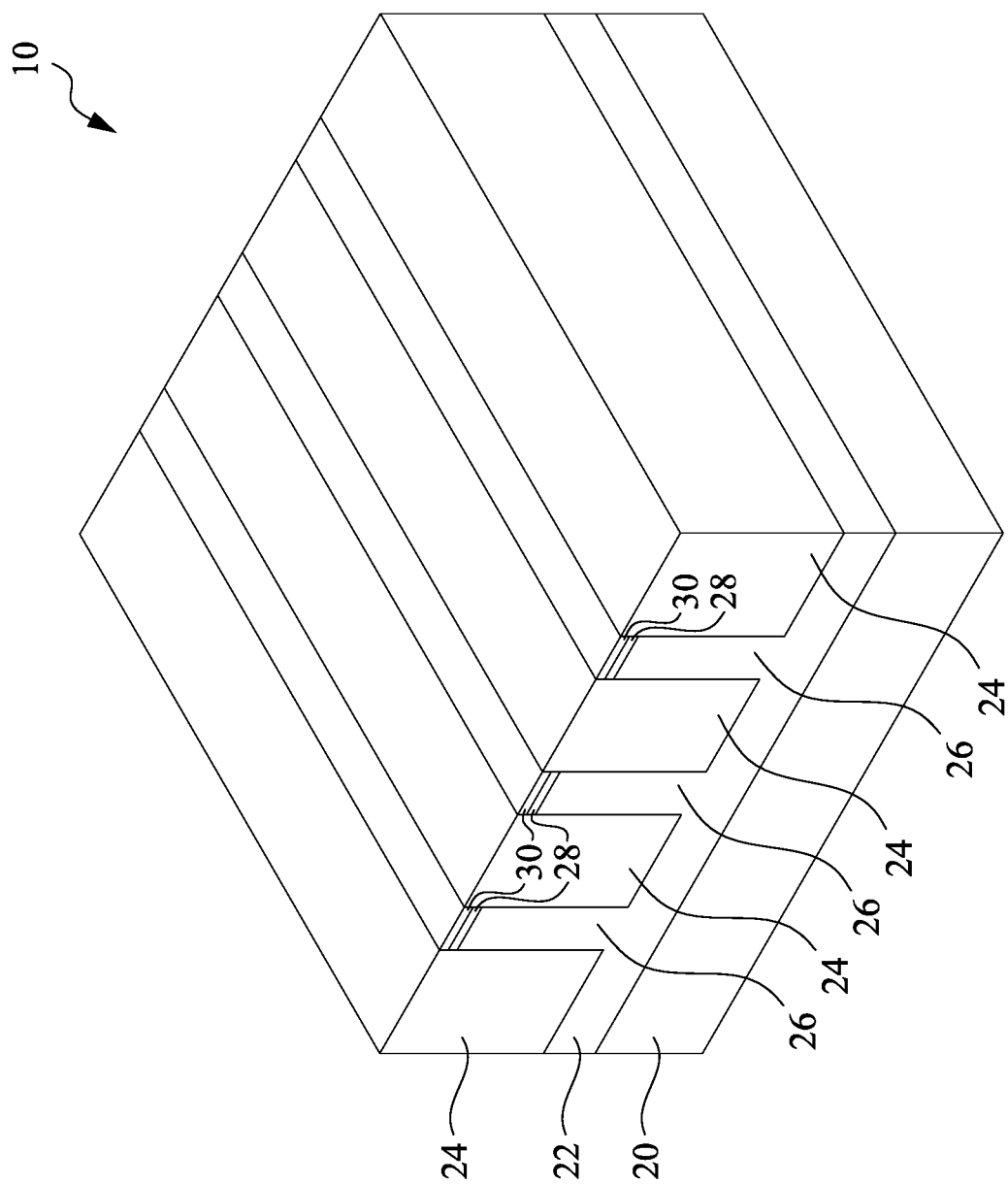

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 204 in the process flow 200 as shown in FIG. 22. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed through thermal nitriding of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excess portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
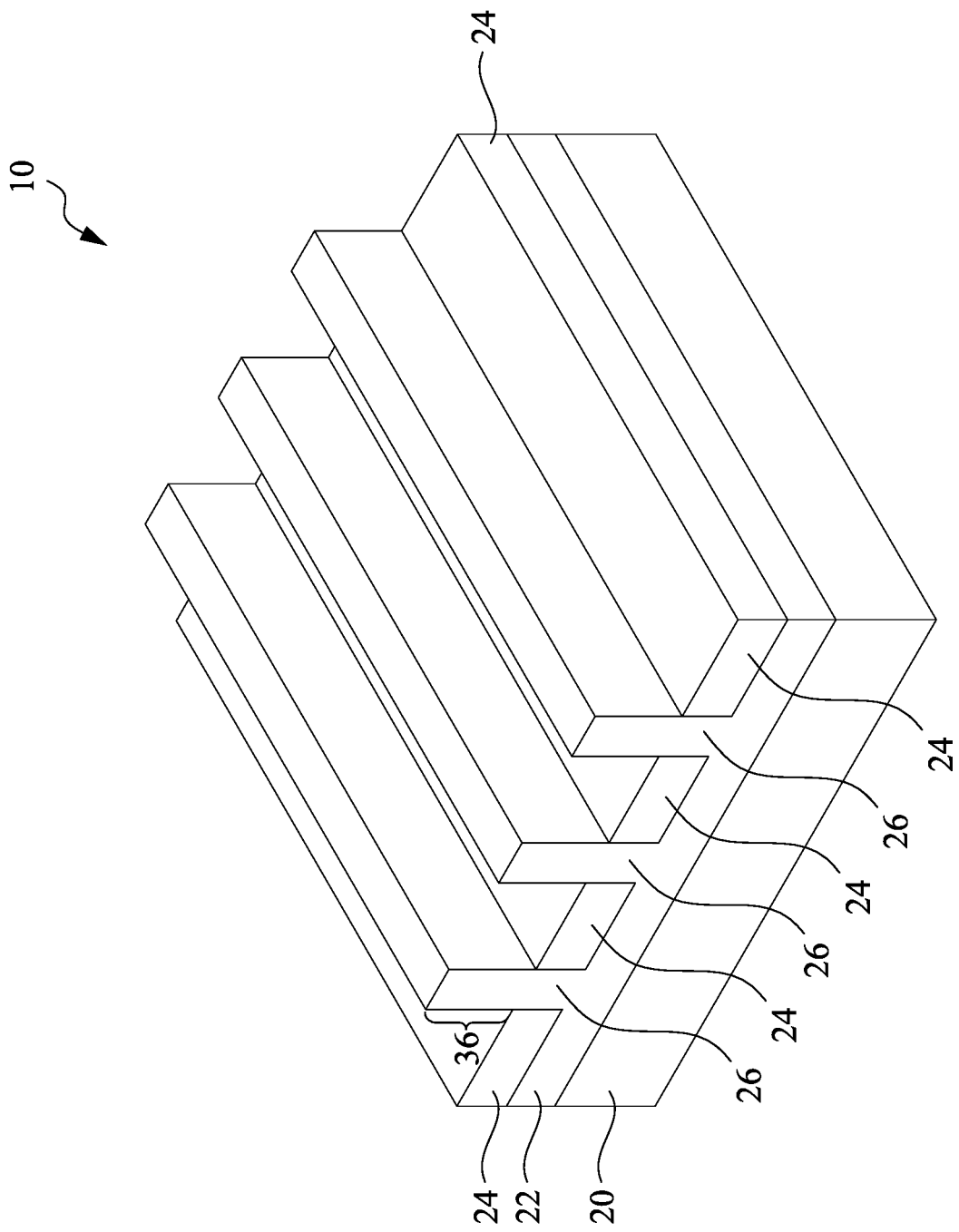

Referring to FIG. 3, STI regions 24 are recessed, so that the top portions of semiconductor strips 26 protrude higher than the top surfaces 24T of the remaining portions of STI regions 24 to form protruding fins 36. The respective process is illustrated as process 206 in the process flow 200 as shown in FIG. 22. The etching may be performed using a dry etching process, wherein the mixture of HF$_3$ and NH$_3$, for example, is used as the etching gas. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
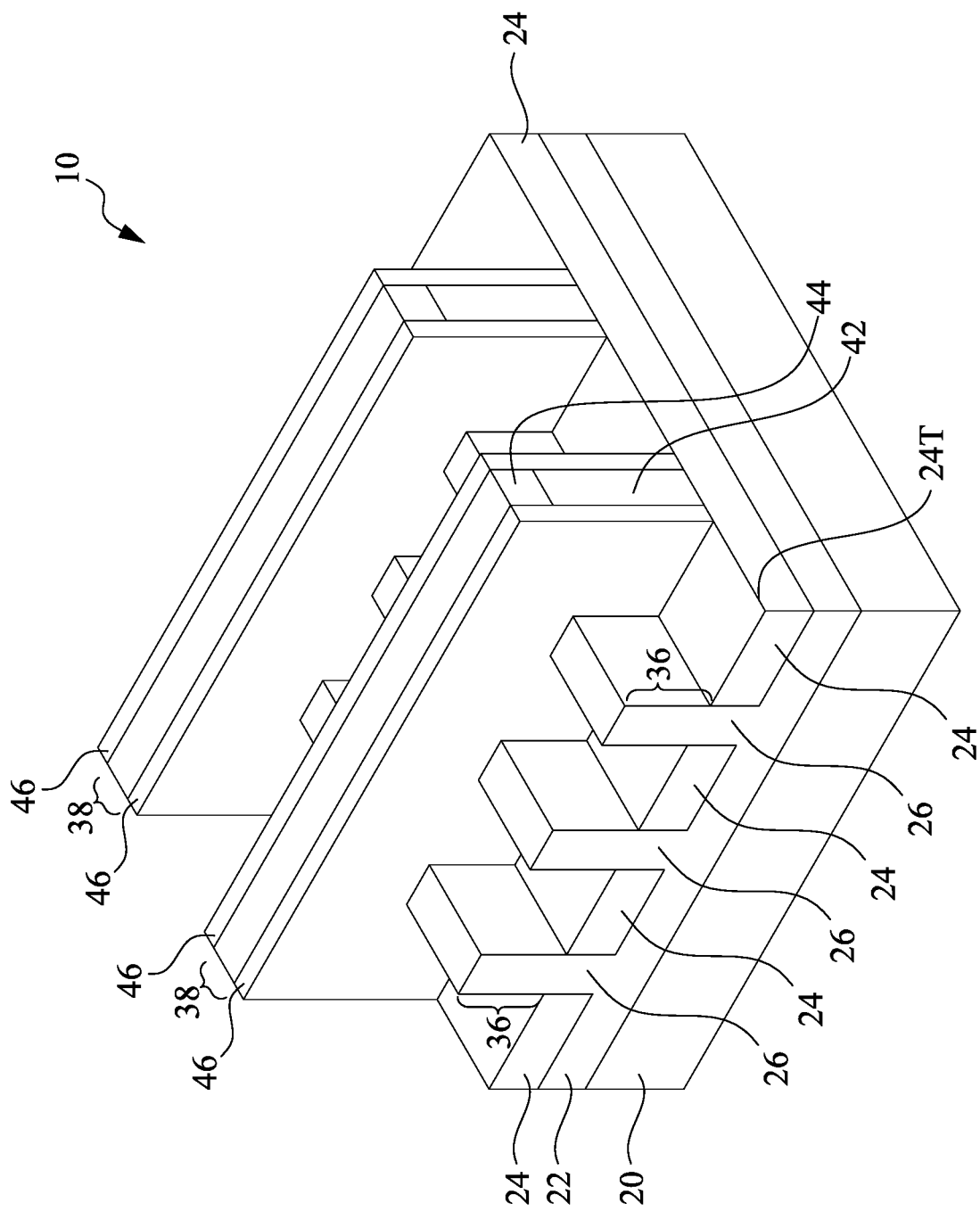

Referring to FIG. 4, dummy gate stacks 38 are formed to extend on the top surfaces and the sidewalls of (protruding) fins 36. The respective process is illustrated as process 208 in the process flow 200 as shown in FIG. 22. Dummy gate stacks 38 may include dummy gate dielectrics 40 (shown in FIG. 7B) and dummy gate electrodes 42 over dummy gate dielectrics 40. Dummy gate electrodes 42 may be formed, for example, using polysilicon or amorphous silicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 208 in the process flow 200 as shown in FIG. 22. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
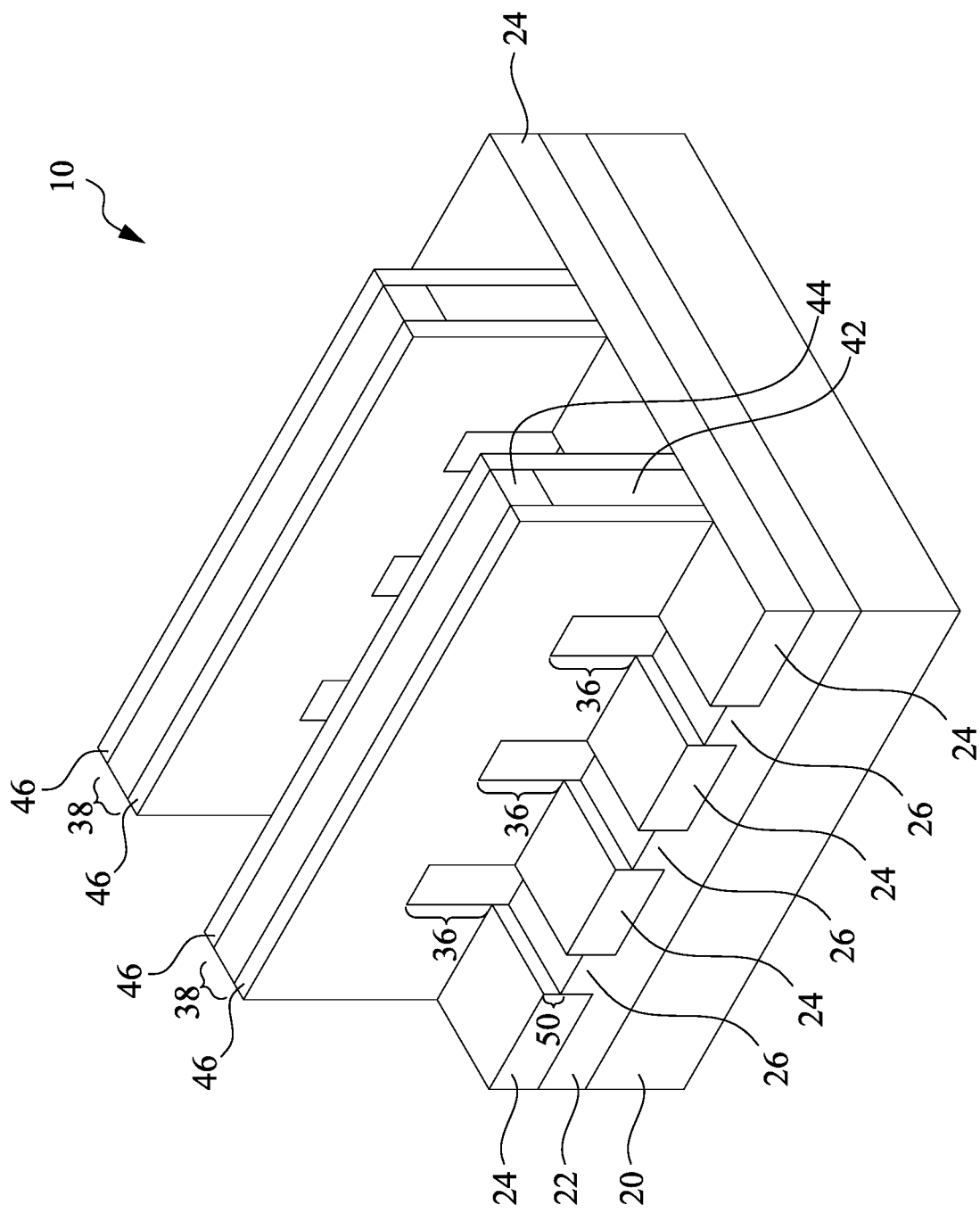

The portions of protruding fins 36 that are not covered by dummy gate stacks 38 and gate spacers 46 are then etched, resulting in the structure shown in FIG. 5. The respective process is illustrated as process 210 in the process flow 200 as shown in FIG. 22. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24T of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
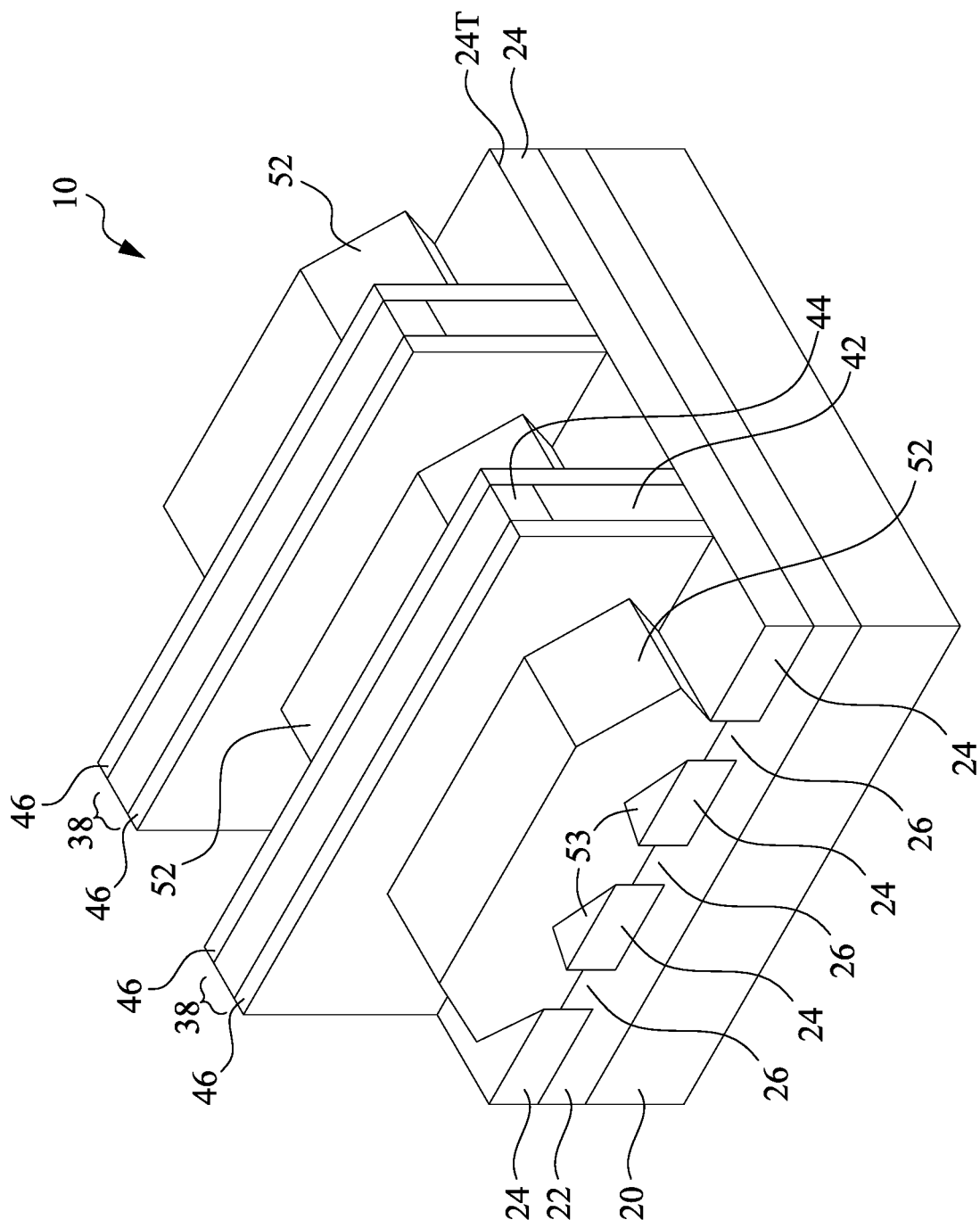

Next, epitaxy regions (source/drain regions) 52 are formed by selectively growing (through epitaxy) a semiconductor material in recesses 50, resulting in the structure in FIG. 6. The respective process is illustrated as process 212 in the process flow 200 as shown in FIG. 22. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 52 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 52, the further epitaxial growth of epitaxy regions 52 causes epitaxy regions 52 to expand horizontally, and facets may be formed. The further growth of epitaxy regions 52 may also cause neighboring epitaxy regions 52 to merge with each other. Voids (air gaps) 53 may be generated.

After the epitaxy process, epitaxy regions 52 may be further implanted with a p-type or an n-type impurity to form source and drain regions, which are also denoted using reference numeral 52. In accordance with alternative embodiments of the present disclosure, the implantation process is skipped when epitaxy regions 52 are in-situ doped with the p-type or n-type impurity during the epitaxy.

Figure 7A:
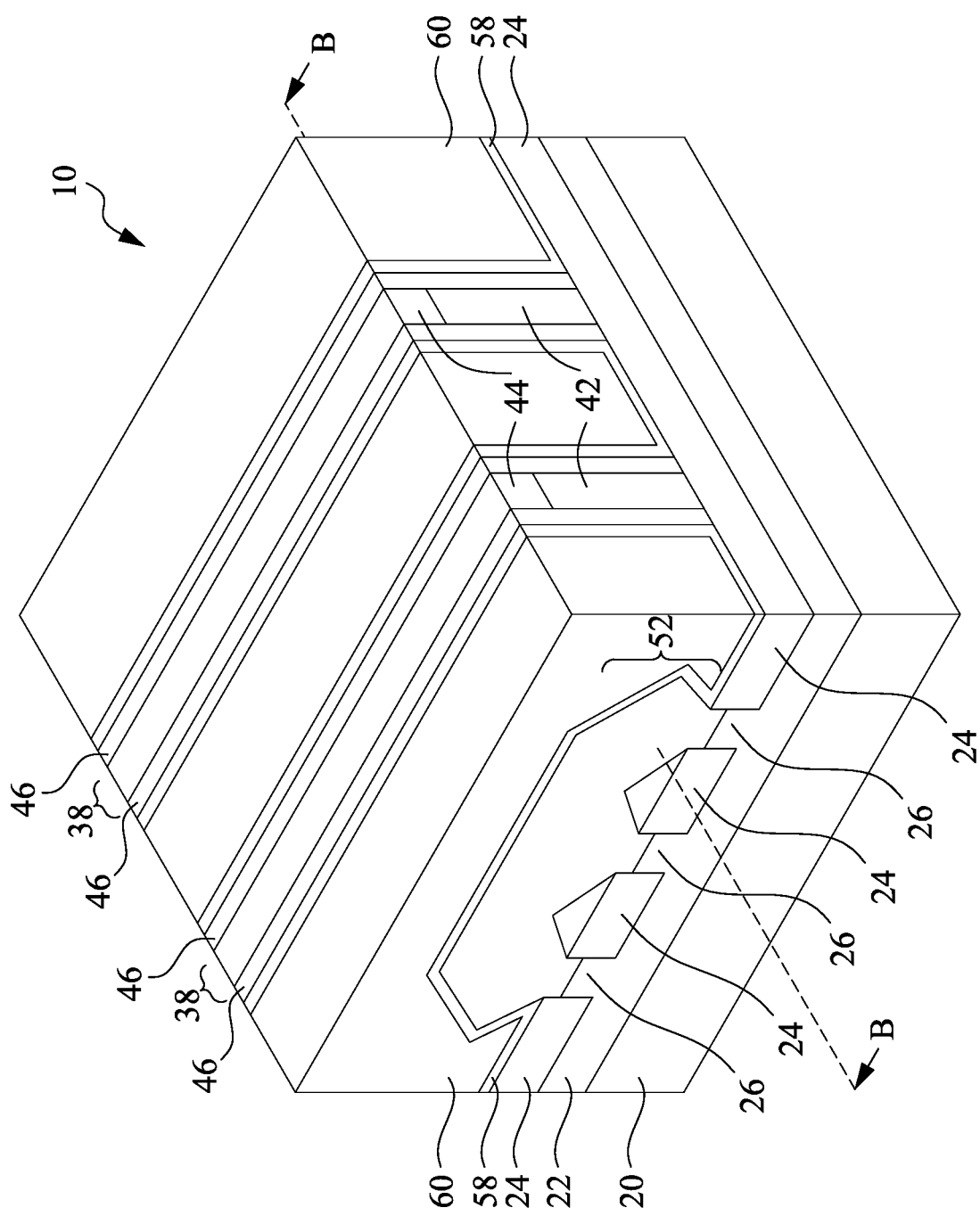
Figure 7B:
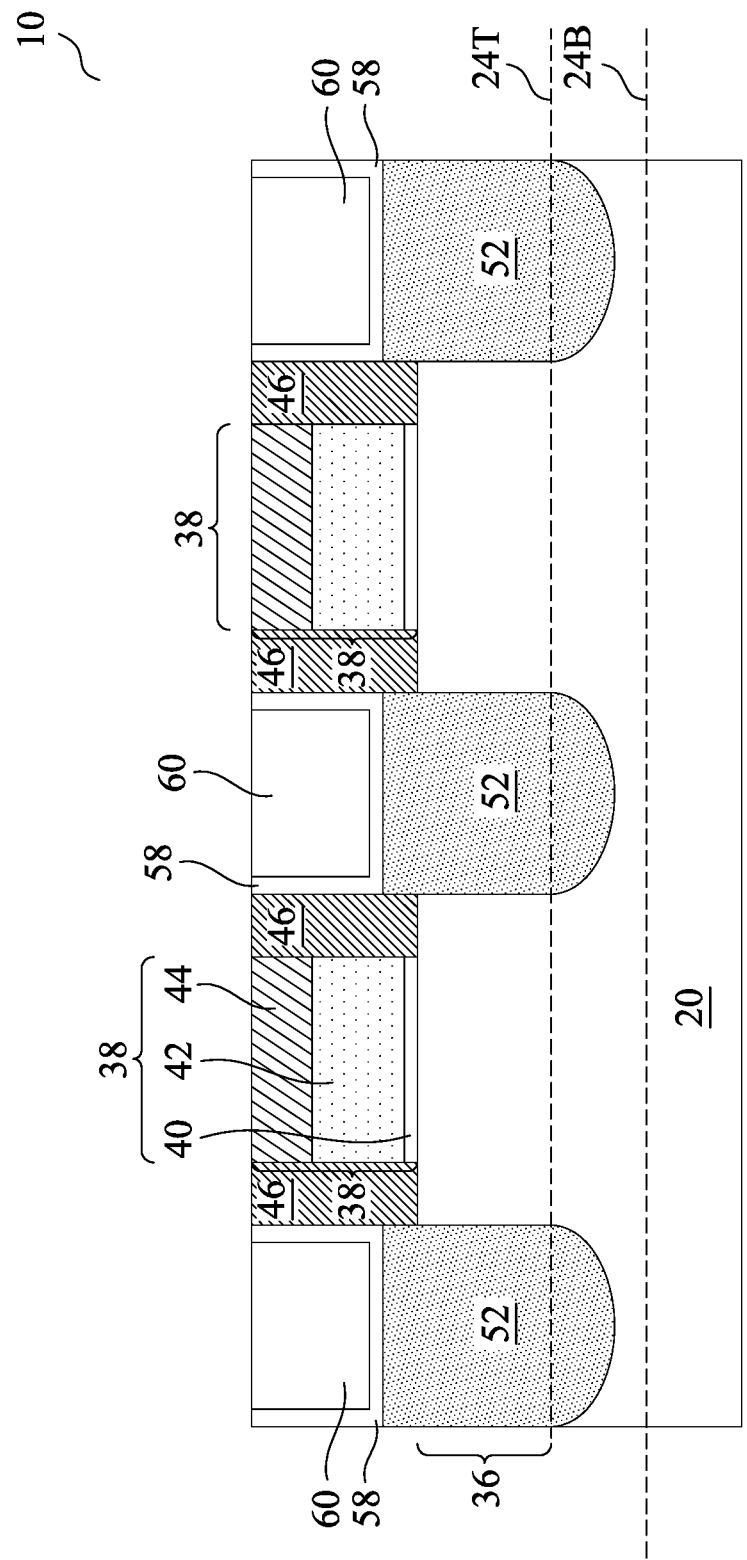

FIG. 7A illustrates a perspective view of the structure after the formation of Contact Etch Stop Layer (CESL) 58 and Inter-Layer Dielectric (ILD) 60. The respective process is illustrated as process 214 in the process flow 200 as shown in FIG. 22. FIG. 7B illustrates a vertical plane in the reference cross-section B-B of the structure in FIG. 7A. CESL 58 may be formed of silicon oxide, silicon nitride, silicon carbo-nitride, aluminum oxide, aluminum nitride, or the like, and may be formed using CVD, ALD, or the like. ILD 60 may include a dielectric material formed using, for example, PECVD, FCVD, spin-on coating, CVD, or another deposition method. In accordance with some embodiments, the deposition of ILD is performed with plasma, for example, when PECVD is used. ILD 60 may be formed of an oxygen-containing dielectric material, which may be a silicon-oxide based material formed using Tetra Ethyl Ortho Silicate (TEOS) as a precursor, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 8:
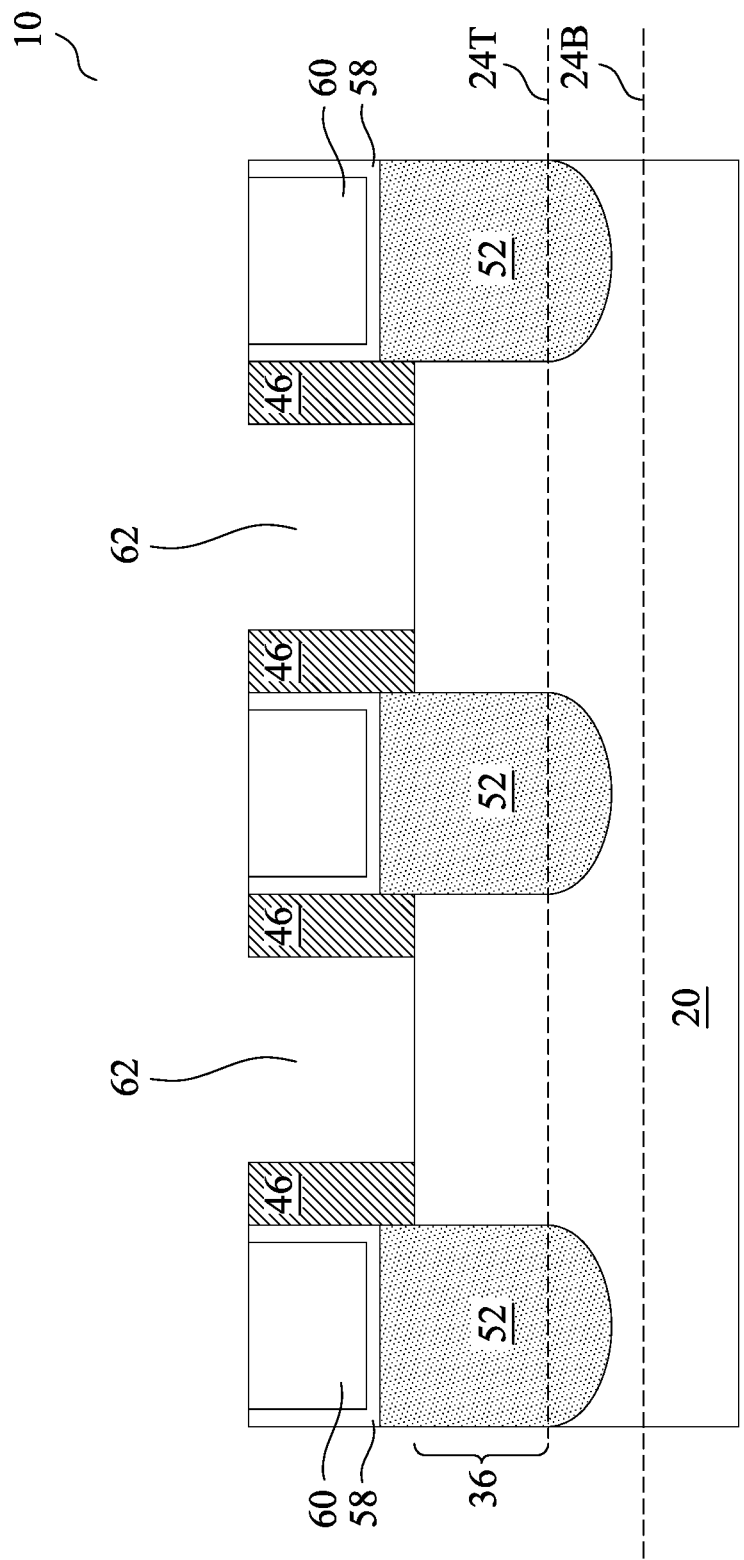
Figure 9:
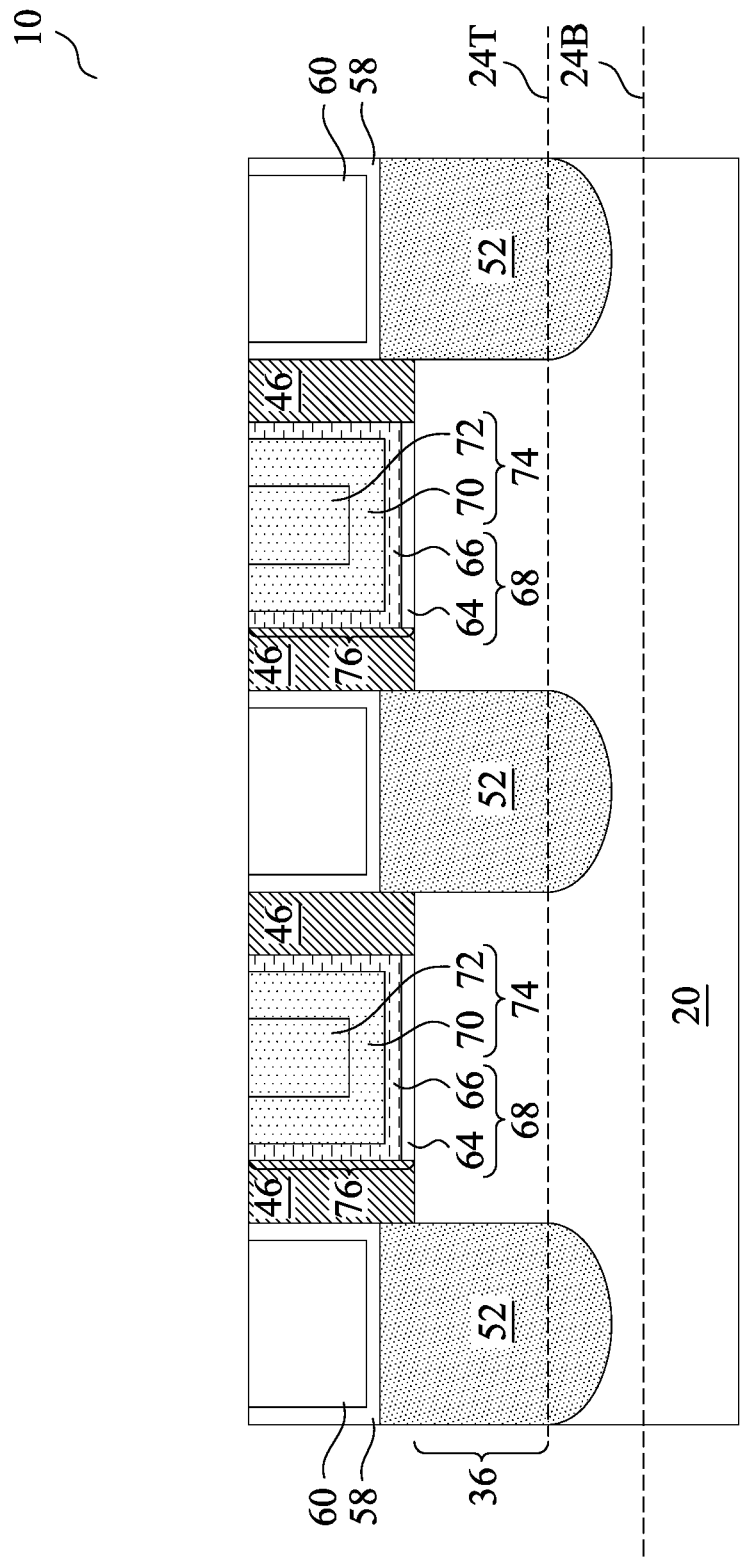

After the structure shown in FIGS. 7A and 7B is formed, dummy gate stacks 38 are replaced with replacement gate stacks, which include replacement gate electrodes and replacement gate dielectrics, as shown in FIGS. 8 and 9. The cross-sectional views shown in FIGS. 8 and 9 and the subsequent FIGS. 10 through 19 are obtained from the same vertical plane in the reference cross-section B-B in FIG. 7A. In FIGS. 7B and 8-19, the level of the top surface 24T and the level of the bottom surface 24B of STI regions 24 are illustrated, while STI regions 24 are not illustrated since STI regions are not in the illustrate plane. Semiconductor fins 36 are over the level of top surface 24T.

When replacing gate stacks, hard mask layers 44, dummy gate electrodes 42, and dummy gate dielectrics 40 as shown in FIGS. 7A and 7B are first removed in one or a plurality of etching steps, resulting in trenches/openings 62 as shown in FIG. 8. The respective process is illustrated as process 216 in the process flow 200 as shown in FIG. 22. The top surfaces and the sidewalls (not in the illustrated plane) of protruding semiconductor fins 36 are exposed to trenches 62.

Next, replacement gate stacks 76 are formed. The respective process is illustrated as process 218 in the process flow 200 as shown in FIG. 22. Referring to FIG. 9, (replacement) gate dielectrics 68 are formed, which extend into trenches 62 (FIG. 8). In accordance with some embodiments of the present disclosure, gate dielectrics 68 include Interfacial Layer (IL) 64 as their lower parts. ILs 64 are formed on the exposed surfaces of protruding fins 36. Each IL 64 may include an oxide layer such as a silicon oxide layer, which is formed through the thermal oxidation of the respective protruding fin 36, a chemical oxidation process, or a deposition process. Gate dielectrics 68 may also include high-k dielectric layers 66 formed over the respective ILs 64. High-k dielectric layers 66 may be formed of or comprise a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. High-k dielectric layers 66 are overlying, and may contact, ILs 64. High-k dielectric layers 66 are formed as conformal layers, and at the time of deposition, extend on the sidewalls of protruding fins 36 and the top surfaces and the sidewalls of gate spacers 46. In accordance with some embodiments of the present disclosure, high-k dielectric layers 66 are formed using ALD or CVD.

Referring further to FIG. 9, stacked layers 70 are deposited. The sub-layers in stacked layers 70 are not shown separately, while the sub-layers may be distinguishable from each other. The deposition may be performed using conformal deposition processes such as ALD, CVD, or the like, so that the thickness of the vertical portions and the thickness of the horizontal portions of stacked layers 70 (and each of sub-layers) are substantially equal to each other. Stacked layers 70, when deposited, extend into trenches 62 (FIG. 8), and include some portions over ILD 60.

Stacked layers 70 may include a diffusion barrier layer and one (or more) work-function layer over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer, a TiN layer over the TaN layer, and a TiAl layer over the TiN layer. After the deposition of the work-function layer(s), a conductive capping layer, which may be another TiN layer, is formed.

Next, metallic filling material 72 is deposited, which may be formed of tungsten or cobalt, for example. Filling material 72 fully fills remaining trenches 62 (FIG. 8). Gate dielectrics 68, stacked layers 70, and filling material 72 as deposited include portions in trenches 62, and other portions over ILD 60. In a subsequent process, a planarization step such as a CMP process or a mechanical grinding process is performed, so that the portions of the deposited layers over ILD 60 are removed. As a result, metal gate electrodes 74 are formed, which include the remaining portions of stacked layers 70 and filling material 72. Replacement gate dielectrics 68 and replacement gate electrodes 74 are in combination referred to as replacement gate stacks 76 hereinafter. As shown in FIG. 9, the top surfaces of replacement gate stacks 76, gate spacers 46, CESL 58, and ILD 60 may be substantially coplanar at this time. Accordingly, the various layer in replacement gate stacks 76, including the high-k dielectric layer 66, stacked layers 70 (including work-function layers and metal capping layers), and filling material 72 are exposed.

Figure 10:
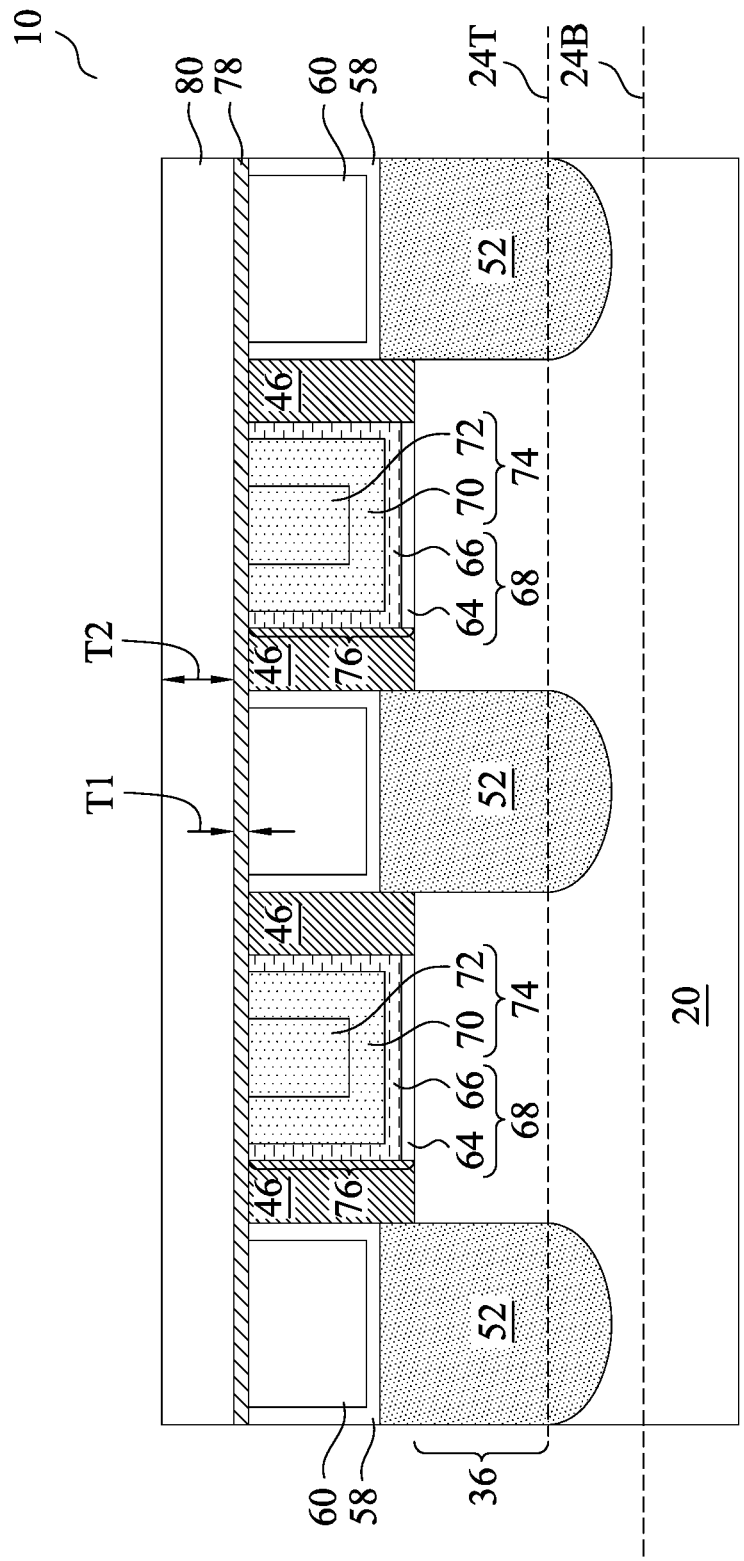

FIG. 10 illustrates the formation of capping layer 78. The respective process is illustrated as process 220 in the process flow 200 as shown in FIG. 22. In accordance with some embodiments, capping layer 78 is formed of a material free from oxygen, and may be formed of or comprise silicon nitride (SiN), silicon carbide (SiC), silicon carbo-nitride (SiCN), or the like. The deposition of capping layer 78 may be performed using CVD, ALD, PECVD, Plasma Enhanced CVD (PECVD), PVD, or the like.

ILD 80 is formed over capping layer 78. The respective process is illustrated as process 222 in the process flow 200 as shown in FIG. 22. ILD 80 may include a dielectric material formed using, for example, FCVD, spin-on coating, CVD, PECVD, or another deposition method. ILD 80 may be formed of or comprise an oxygen-containing dielectric material, which may be a silicon-oxide based material formed using TEOS as a precursor, PSG, BSG, BPSG, or the like. ILD 80 may include Si, O, C, N, or the like, and may include other elements.

It is appreciated that the processes performed after the deposition of capping layer 78 may include a plurality of thermal process. If capping layer 78 is not formed, and ILD 80 contacts the top surfaces of gate electrodes 74, the thermal processes may result in the oxygen in ILD 80 to diffuse into the top portions of metal gate electrodes 74, and cause the oxidation of the top portions of metal gate electrodes 74. Furthermore, the deposition of ILD 80 may be performed using plasma, which accelerates the diffusion and oxidation processes. The oxidation of metal gate electrodes 74 may result in the undesirable shift of the threshold voltage of the resulting FinFET. In the embodiments of the present disclosure, capping layer 78 has the function of blocking the oxygen in ILD 80 from penetrating through and to oxidize the top portion of metal gate electrodes 74. The oxygen-blocking ability of capping layer 78 is related to the material and the thickness of capping layer 78. For example, silicon nitride containing materials have good ability for blocking oxygen, and may be used for forming capping layer 78. Capping layer 78 may not be too thin or too thick. When capping layer 78 is too thin (for example, thinner than about 3 nm), it does not have adequate ability for blocking oxygen. When capping layer 78 is too thick (for example, thicker than about 5 nm), its oxygen-blocking ability is saturated, while the negative effect starts to dominate. For example, the negative effect includes the difficulty in etching-through it in the etching processes shown in FIGS. 11 and 15. Furthermore, since capping layer 78 has a high dielectric constant value, a thick capping layer 78 may result in higher parasitic capacitance between neighboring conductive features. In accordance with some embodiments, thickness T1 of capping layer 78 is in the range between about 3 nm and about 5 nm. ILD 80 may have thickness T2 greater than about 30 nm, or in the range between about 30 nm and about 500 nm. Ratio T2/T1 may be greater than 10, and may be greater than 20.

FIGS. 11 through 16 illustrate the formation of source/drain contact plugs and gate contact plugs. In the illustrated example, source/drain contact plugs and gate contact plugs are illustrated in a same plane. In other embodiments, source/drain contact plugs and gate contact plugs are formed in different planes, so that they are spaced far from each other in order to prevent the electrical shorting between neighboring source/drain contact plugs and gate contact plugs.

Figure 11:
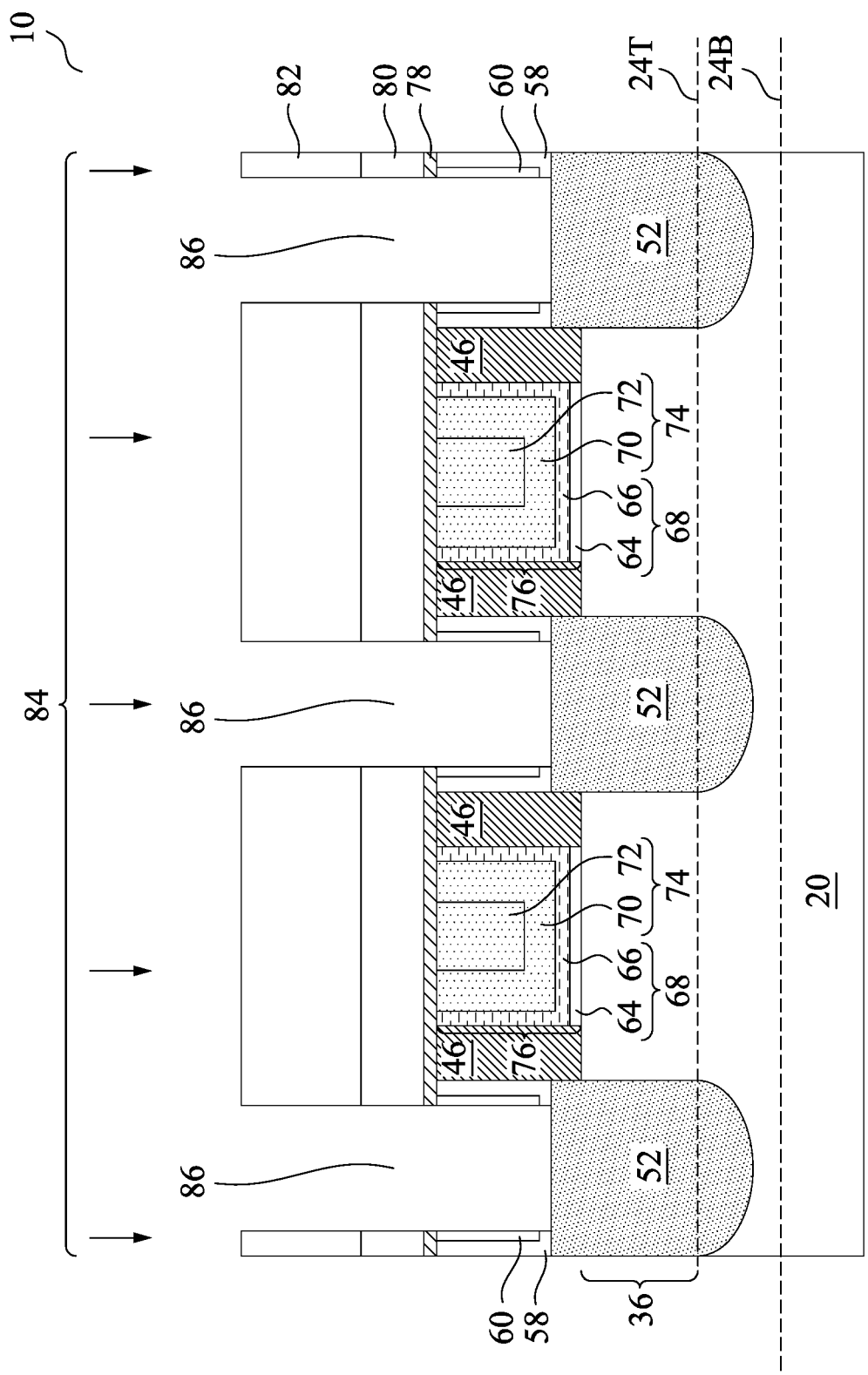
Figure 12:
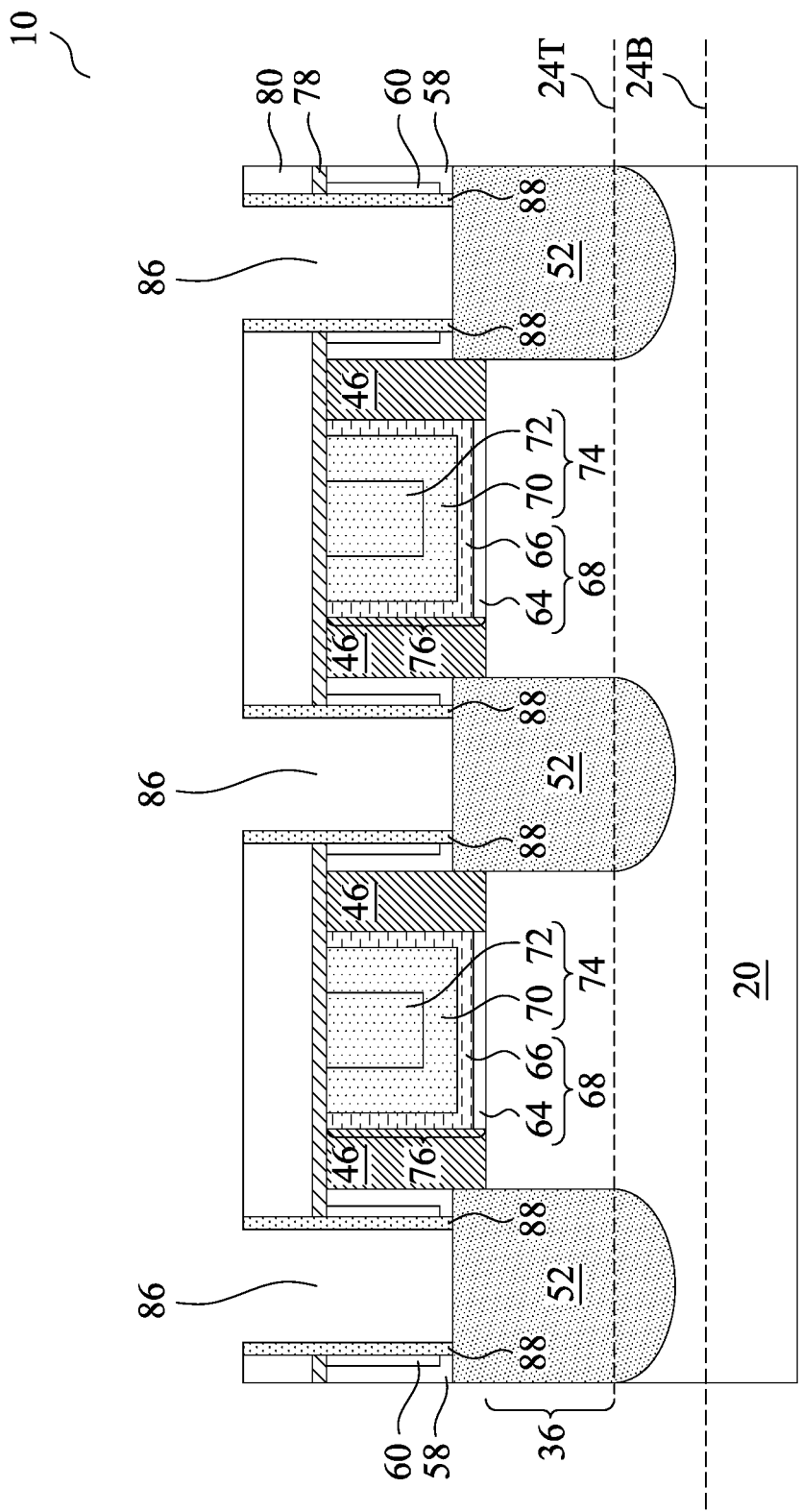
Figure 13:
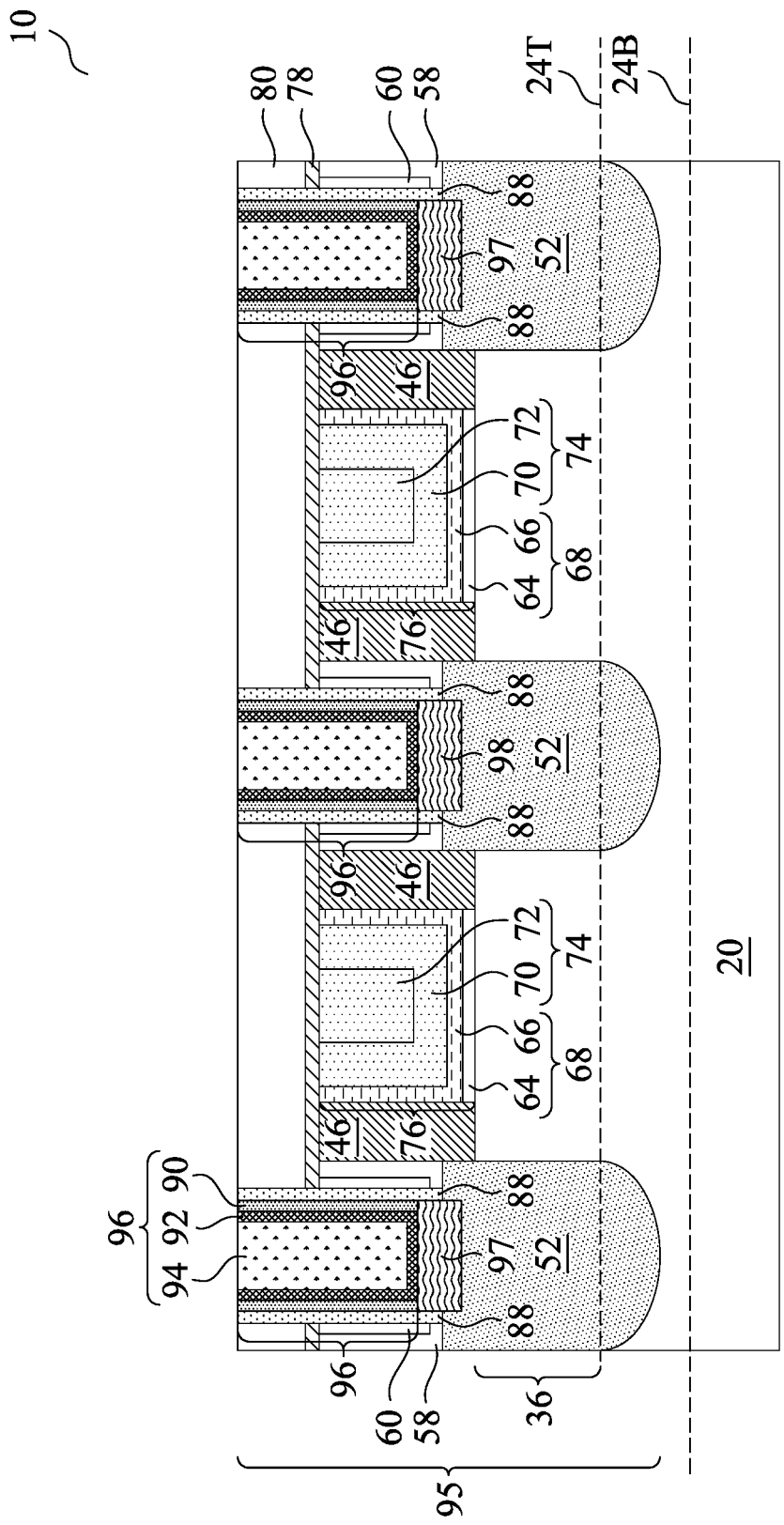

FIGS. 11 through 13 illustrate the formation of source/drain contact plugs. Referring to FIG. 11, etching mask 82, which may be or may comprise a photo resist, is applied/deposited and patterned. Next, etching process 84 is performed to form source/drain contact openings 86. The respective process is illustrated as process 224 in the process flow 200 as shown in FIG. 22. Etching process 84 is anisotropic and may be a dry etching process, for example, performed using Reactive Ion Etching (RIE). The etching gases are selected according to the materials of ILD 80, capping layer 78, ILD 60, and CESL 58.

In accordance with some embodiments, ILD 80, capping layer 78 and ILD 60 are etched-through, and the etching process is stopped on CESL 58. The etching may not be (or may be) stopped on capping layer 78, and is not stopped on ILD 60 during the etching process. Alternatively stated, the etching process 84 may be continuous without being stopped until CESL 58 is reached. For example, the etching gas may include a mixture of a first etching gas for etching ILDs 80 and 60, and a second etching gas for etching capping layer 78. In accordance with some embodiments, the first etching gas is able to etch ILDs 80 and 60, but is not able to etch capping layer 78, and the second etching gas is able to etch capping layer 78, but is not able to etch ILDs 80 and 60. The first etching gas may be selected from the mixture of $NF_3$ and $NH_3$, the mixture of HF and $NH_3$, or combinations thereof. The second etching gas may be a fluorine-containing gas such as the mixture of $CF_4$, $O_2$, and $N_2$, the mixture of $NF_3$ and $O_2$, $SF_6$, the mixture of $SF_6$ and $O_2$, or the like. Furthermore or alternatively, the bias power in the etching process may be increased to ensure the etching is not stopped on capping layer 78 and ILD 60, and process gases such as Ar may be added, so that the etching is not stopped on capping layer 78. For example, ILDs 80 and 60 may be etched in chemical reactions, while capping layer 78 is removed partially by the bombarding effect during the etching process. The etching gas and the material of CESL 58 are selected so that the etching may be stopped on CESL 58. Another etching process is then performed to etch-through CESL 58. The etching of CESL 58 may be performed using a dry etching process or a wet etching process, and may be anisotropic or isotropic. The etching gas for etching CESL 58 is different from the etching gas for etching ILD 80, capping layer 78, and ILD 60.

In accordance with alternative embodiments, the formation of openings 86 includes a plurality of etching processes including a first etching process for etching ILD 80, a second etching process for etching capping layer 78, a third etching process for etching ILD 60, and a fourth etching process for etching CESL 58. The first, the second, the third etching processes may be anisotropic (and dry) etching processes, while the fourth etching process may be wet or dry. After the formation of openings 86, etching mask 82 is removed. In accordance with these embodiments, the etching gas of each of the capping layer 78, ILD 60, and CESL 58 may be different from the etching gas used for etching its immediately overlying layer.

Referring to FIG. 12, dielectric contact spacers 88 are formed in accordance with some embodiments. The respective process is illustrated as process 226 in the process flow 200 as shown in FIG. 22. The formation process includes depositing a blanket dielectric layer, for example, using a conformal deposition method such as CVD or ALD. The dielectric layer may be a high-k dielectric layer with a k value greater than 3.9, so that it has good isolation ability. The candidate materials include $Al_xO_y$, $HfO_2$, SiN, SiOCN, and the like. The thickness of the dielectric layer may be in the range between about 2 nm and about 4 nm. The dielectric layer may also include silicon oxide or a low-k dielectric layer for reducing parasitic capacitance, depending on the specific requirement of the circuit. An anisotropic etch is then performed, so that the horizontal portions of the dielectric layer are removed, and the remaining vertical portions in openings 86 form contact spacer 88, each forming a ring when viewed from the top of wafer 10. In accordance with alternative embodiments, the formation of dielectric contact spacers 88 is skipped.

FIG. 13 illustrates the formation of source/drain contact plugs 96. The respective process is illustrated as process 228 in the process flow 200 as shown in FIG. 22. In the corresponding formation process, metal layer 90 (such as a titanium layer or a cobalt layer) is deposited, for example, using PVD, which is formed as a blanket layer including portions extending into openings 86 (FIG. 12) to contact source/drain regions 52, and some portions over ILD 80. A barrier layer 92, which may be a metal nitride layer such as a titanium nitride layer or a tantalum nitride layer, is then formed over metal layer 90. Barrier layer 92 may be formed by nitridizing a top layer of metal layer 90, leaving the bottom layer of metal layer 90 not nitridized, or may be formed using a deposition method such as CVD. Layers 90 and 92 are both conformal, and extend into openings 86.

An annealing process is then performed to form source/drain silicide regions 97. The annealing process may be performed through Rapid Thermal Anneal (RTA), furnace anneal, or the like. Accordingly, the bottom portion of metal layer 90 reacts with source/drain regions 52 to form silicide regions 97. The sidewall portions of metal layer 90 remain after the silicidation process. In accordance with some embodiments of the present disclosure, the top surface of silicide regions 97 is in contact with the bottom surface of barrier layer 92.

Next, as also shown in FIG. 13, metallic material 94 is deposited over and in contact with barrier layer 92. Metallic material 94 may include tungsten, cobalt, or the like. A planarization process such as a CMP process or a mechanical grinding process is then performed to remove the portions of layers 90, 92, and 94 over ILD 80. The remaining portions of layers 90, 92, and 94 are referred to as source/drain contact plug 96. FinFET 95 is thus formed.

Figure 14:
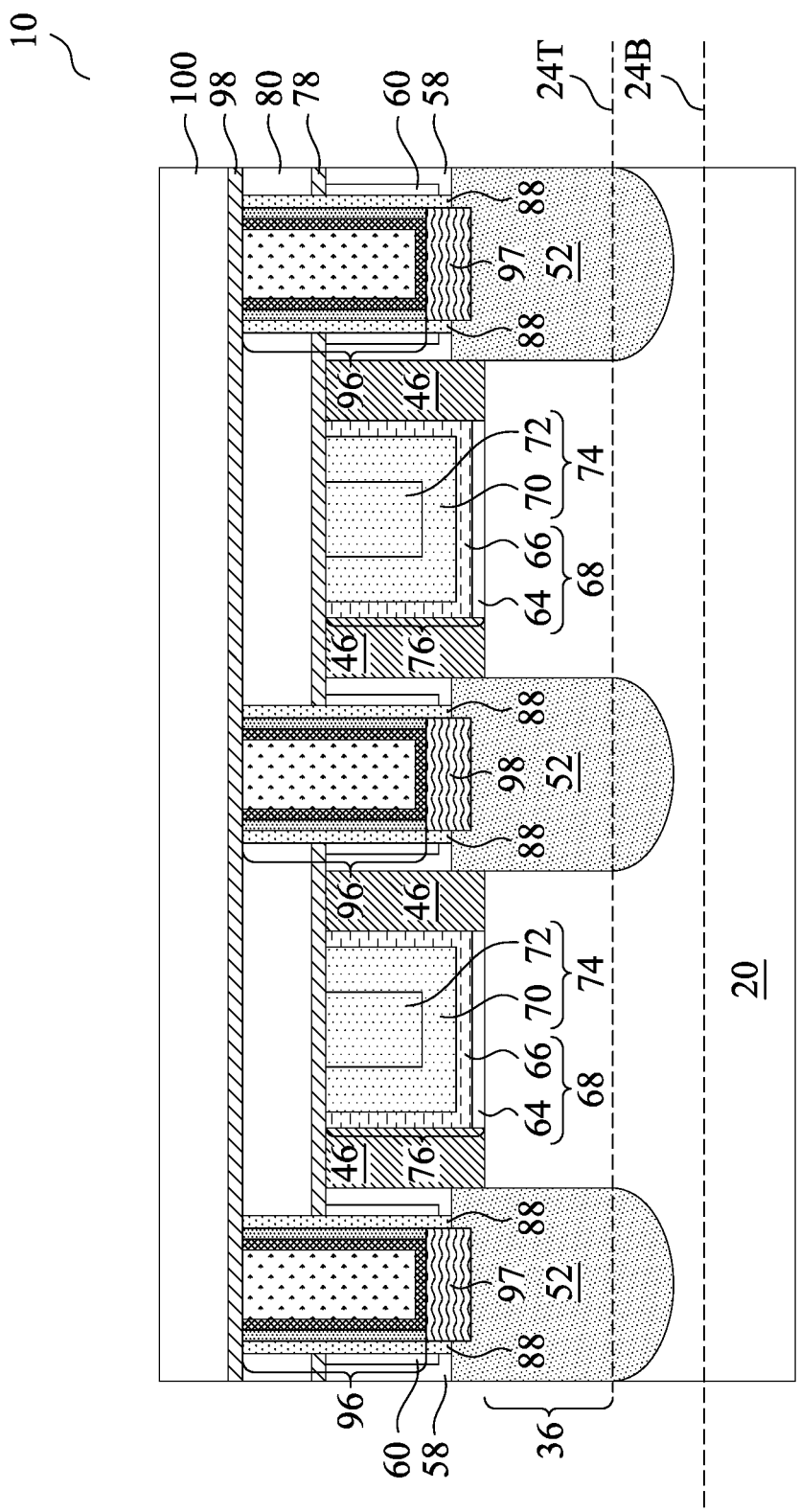

FIG. 14 illustrates the formation of etch stop layer (ESL) 98 and dielectric layer (ILD) 100. The respective process is illustrated as process 230 in the process flow 200 as shown in FIG. 22. Etch stop layer 98 may be oxygen-containing or oxygen-free, and may be formed of aluminum nitride, aluminum oxide, silicon nitride, silicon carbide, silicon oxynitride, silicon carbo-nitride, silicon oxy-carbo-nitride, or the like, or multi-layers thereof, and may be formed using a deposition method such as CVD, ALD, or the like. ILD 100 may include a material selected from PSG, BSG, BPSG, Fluorine-doped Silicon Glass (FSG), silicon oxide, or the like. Dielectric layer 100 may be formed using spin-on coating, FCVD, or the like, or formed through a deposition process such as PECVD or LPCVD.

Figure 15:
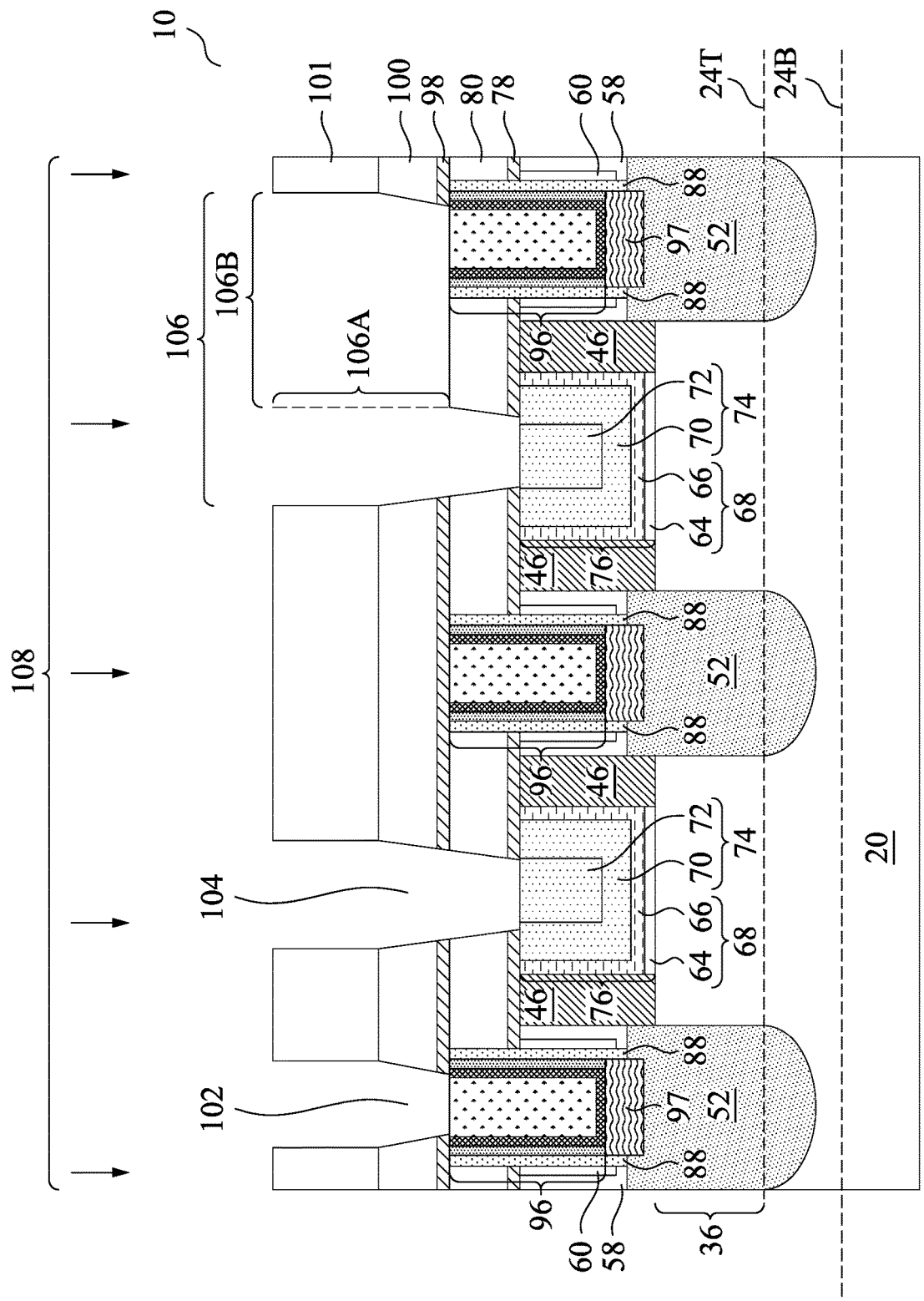

Referring to FIG. 15, ILD 100 and etch stop layer 98 are etched to form openings 102, 104, and 106. The respective process is illustrated as process 232 in the process flow 200 as shown in FIG. 22. Etching mask 101, which may include a photo resist, is formed and patterned. The etching processes are illustrated as etching process 108. It is appreciated that although openings 102, 104, and 106 are shown as being tapered, they may also have vertical edges. Etching process 84 may be anisotropic and may be a dry etching process, for example, performed using RIE. The etching gases are selected according to the materials of ILD 100, etch stop layer 98, ILD 80, and CESL 78. In accordance with some embodiments, opening 106 includes portion 106A and portion 106B, with portion 106A extending to the respective underlying gate electrode 74, and portion 106B extend to the respective underlying source/drain contact plug 96.

In accordance with some embodiments, for forming opening 104 and opening portion 106A, dielectric layers including ILD 100, etch stop layer 98, ILD 80, and capping layer 78 are etched-through without being stopped during the etching process, and the etching process is stopped on gate electrodes 74. For example, the etching gas may include a mixture of a first etching gas for etching ILDs 100 and 80, and a second etching gas for etching etch stop layer 78. In accordance with some embodiments, the first etching gas is able to etch ILDs 100 and 80, but is not able to etch etch stop layer 98 and capping layer 78, and the second etching gas is able to etch etch stop layer 98 and capping layer 78, but is not able to etch ILDs 100 and 80. The first etching gas may be selected from the mixture of $NF_3$ and $NH_3$, the mixture of HF and $NH_3$, or combinations thereof. The second etching gas may be a fluorine-containing gas such as the mixture of $CF_4$, $O_2$, and $N_2$, the mixture of $NF_3$ and $O_2$, $SF_6$, the mixture of $SF_6$ and $O_2$, or the like.

In accordance with alternative embodiments, for forming opening 104 and opening portion 106A, dielectric layers including ILD 100, etch stop layer 98, and ILD 80 are etched-through without being stopped during the etching process, and the etching process is stopped on capping layer 78. In accordance with these embodiments, capping layer 78 is formed of a material different from the materials of ILD 100, etch stop layer 98, and ILD 80. For example, the etching gas may include a first etching gas for etching ILDs 100 and 80, and a second etching gas for etching etch stop layer 98, while none of the first etching gas and the second etching gas is capable of capping layer 78. The first etching gas may be selected from the mixture of $NF_3$ and $NH_3$, the mixture of HF and $NH_3$, or combinations thereof. The second etching gas may be a fluorine-containing gas such as the mixture of $CF_4$, $O_2$, and $N_2$, the mixture of $NF_3$ and $O_2$, $SF_6$, or the mixture of $SF_6$ and $O_2$, or the like. After the etching is stopped on capping layer 78, another etching process is performed to etch through capping layer 78 using an etching gas different from the etching gas for etching ILD 100, etch stop layer 98, and ILD 58. The etching of capping layer 78 may be performed using a dry etching process or a wet etching process, and may be anisotropic or isotropic.

In accordance with alternative embodiments, the formation of openings 102, 104 and 106B includes a plurality of etching processes including a first etching process for etching ILD 100, a second etching process for etching etch stop layer 98, a third etching process for etching ILD 80, and a fourth etching process for etching capping layer 78. The first, the second, the third etching processes may be anisotropic (and dry) etching processes, while the fourth etching process may be wet or dry. After the formation of openings 102, 104 and 106, etching mask 101 is removed.

The formation of openings 102 and opening portion 106B may be performed using a same etching mask (as shown in FIG. 15), or alternatively, opening 102 is formed using a same etching mask as opening 104 and opening portion 106A, and opening portion 106B is formed using a separate etching mask. In the etching of opening 102 (and possibly opening portion 106B also), etch stop layer 98 may be used for etching-stop, and the etching includes etching ILD 100 and stopping on etch stop layer 98, and then etching-through etch stop layer 98 in another etching process using an etching chemical (gas or chemical solution) different from the etching gas for etching ILD 100.

Figure 16:
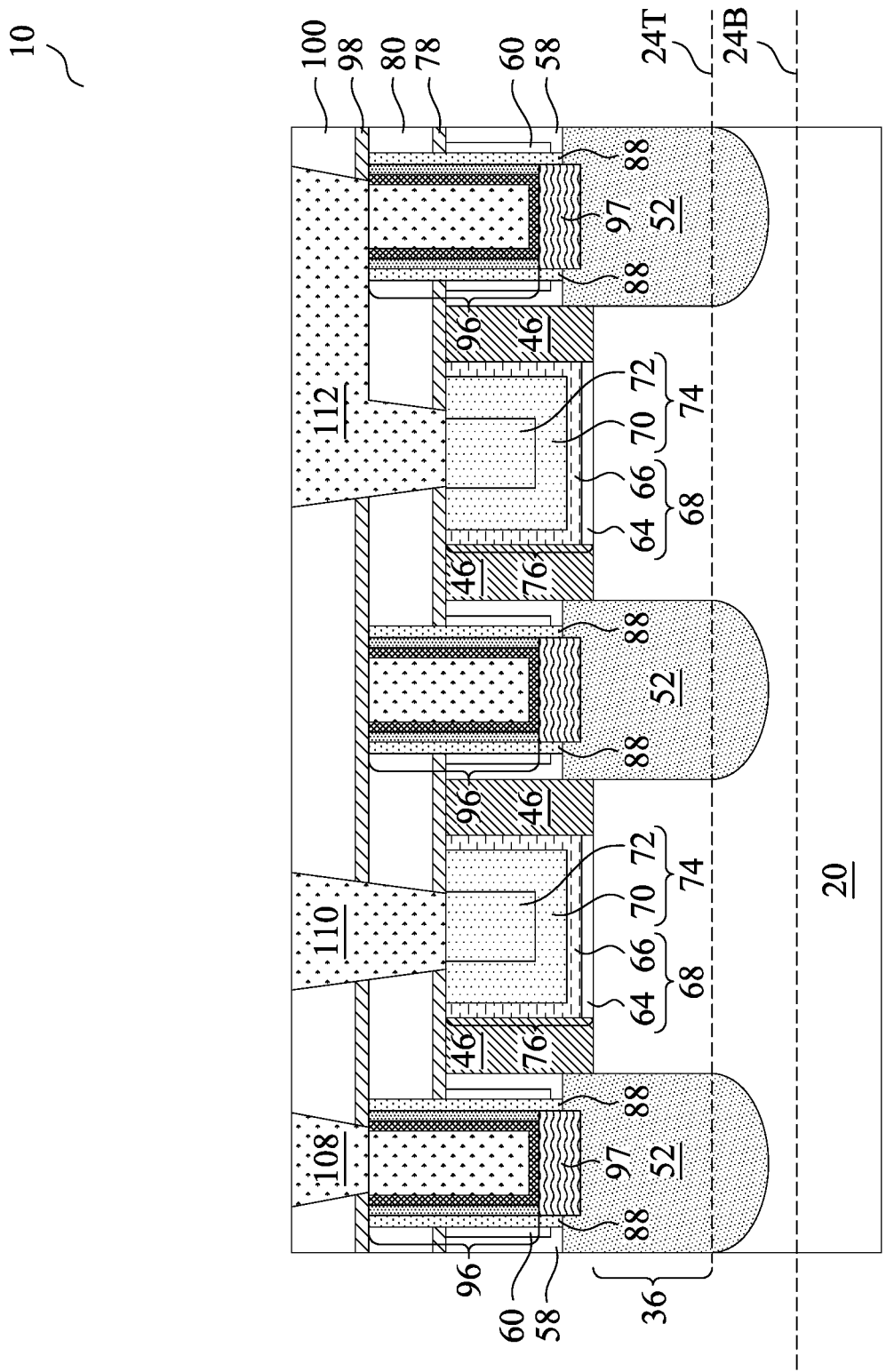

In a subsequent process, openings 102, 104, and 106 are filled with a conductive material(s) to form contact plugs 108, 110, and 112, as shown in FIG. 16. The respective process is illustrated as process 234 in the process flow 200 as shown in FIG. 22. The formation process includes depositing desirable conductive materials/layers, and then performing a planarization process to remove excess materials. In accordance with some embodiments, contact plugs 108, 110, and 112 are formed of a homogenous conductive material, and the entire conductive material has the same composition, and may be formed of either titanium nitride, tungsten, cobalt, or the like. In accordance with alternative embodiments, each of contact plugs 108, 110, and 112 has a composite structure including, for example, a barrier layer and a metallic material over the barrier layer. The barrier layer may be formed of titanium nitride, titanium, tantalum nitride, tantalum, or the like, and the metallic material may be formed of tungsten, cobalt, copper, or the like. Contact plug 112 electrically and physically interconnects gate electrode 74 and source/drain contact plug 96.

Figure 17:
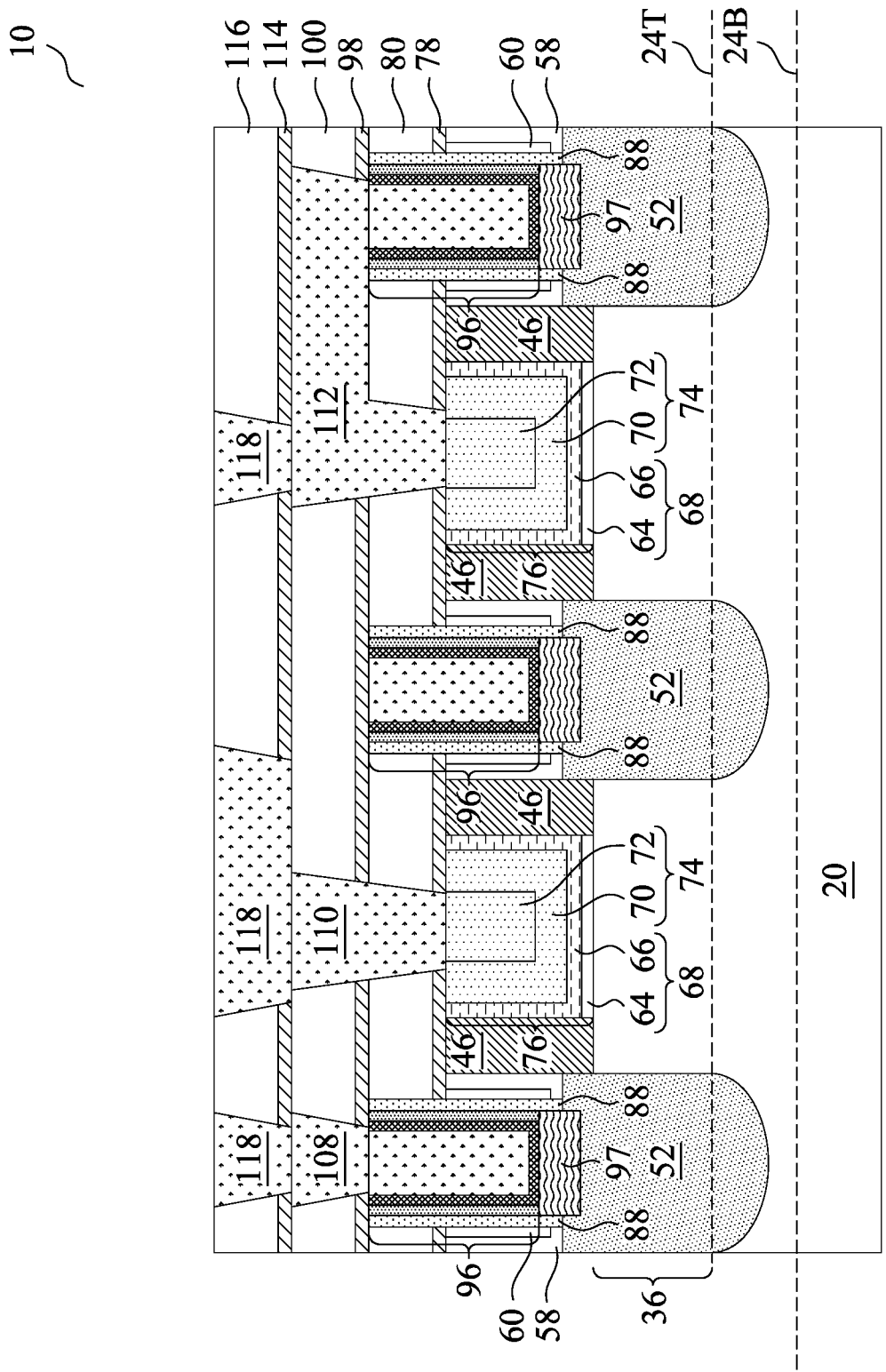

FIG. 17 illustrates the formation of etch stop layer 114, dielectric layer 116 (also referred to as Inter-Metal Dielectric (IMD)), and metal lines 118. Etch stop layer 114 may be formed of SiON, aluminum oxide, aluminum nitride, or the like, or composite layers thereof. In accordance with some embodiments of the present disclosure, Dielectric layer 116 may be formed of a low-k dielectric material having a dielectric constant (k-value) lower than about 3.0. Dielectric layer 116 may be formed of or comprise Black Diamond (a registered trademark of Applied Materials), a carbon-containing low-k dielectric material, Hydrogen SilsesQuioxane (HSQ), MethylSilsesQuioxane (MSQ), or the like. In accordance with some embodiments of the present disclosure, the formation of dielectric layer 116 includes depositing a porogen-containing dielectric material, and then performing a curing process to drive out the porogen, and hence the remaining dielectric layer 116 is porous.

Metal lines 118 are formed in dielectric layer 116. The formation process may include a damascene process, for example, a single damascene process as shown in FIG. 17. The formation process may include etching dielectric layer 116 and etch stop layer 114 to form trenches, filling conductive materials into the trenches, and performing a CMP process to remove excess conductive materials. Each of metal lines 118 may include a diffusion barrier layer, and a metallic material over the diffusion barrier layer. The diffusion barrier layer may be formed of or comprise titanium nitride, tantalum nitride, titanium, tantalum, or the like. The metallic material may include copper or a copper alloy.

Figure 18:
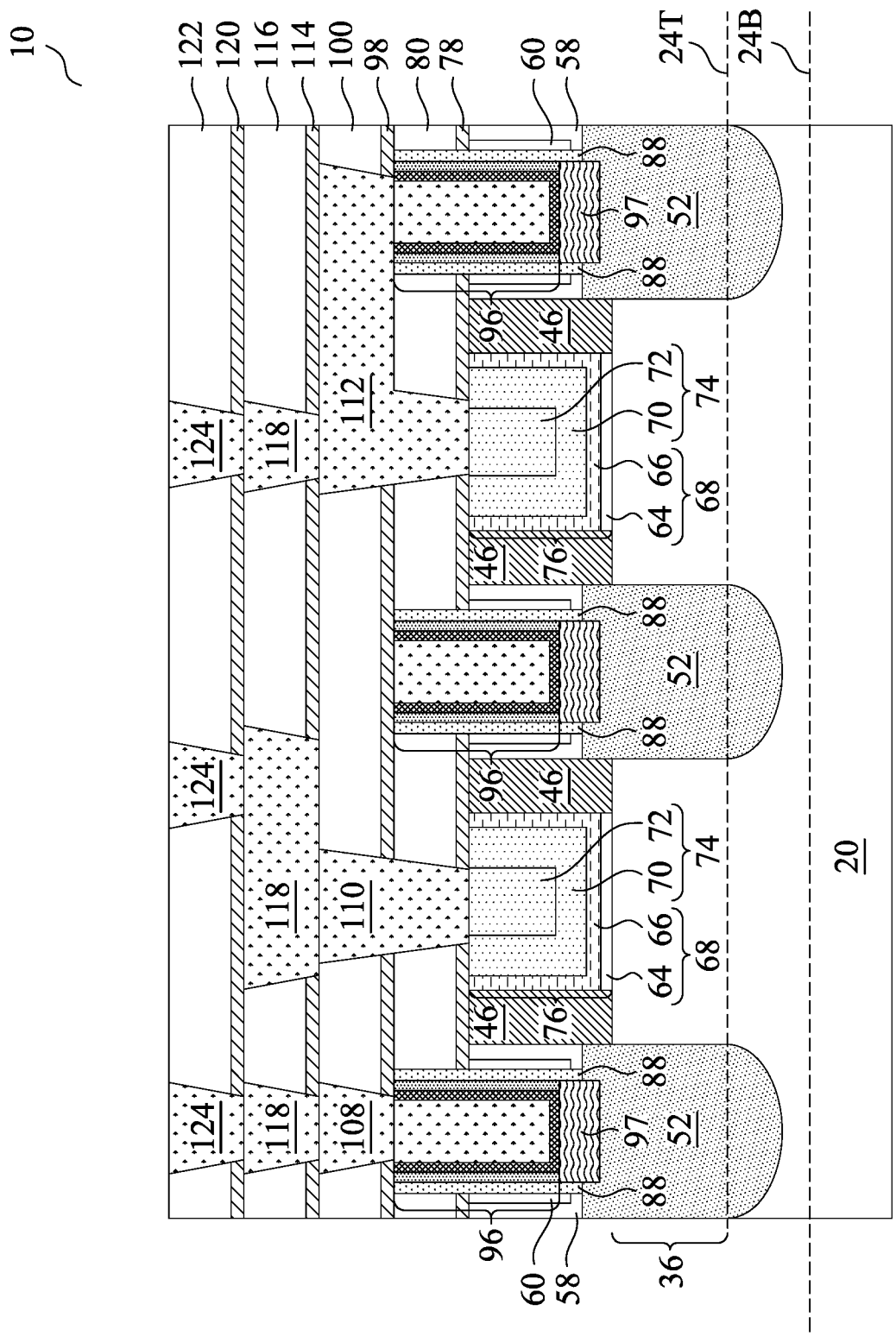

FIG. 18 illustrates the formation of etch stop layer 120, dielectric layer 122, and vias 124. Etch stop layer 120 may be formed of a material similar to the material of etch stop layer 114. Dielectric layer 122 may be formed of a material similar to the material of dielectric layer 116. Vias 124 may be formed using similar processes for forming metal lines 118, and may be formed using a single damascene process. The structures and materials of vias 124 may be similar to that of metal lines 118, except metal lines 118 are more elongated than vias 124.

Figure 19:
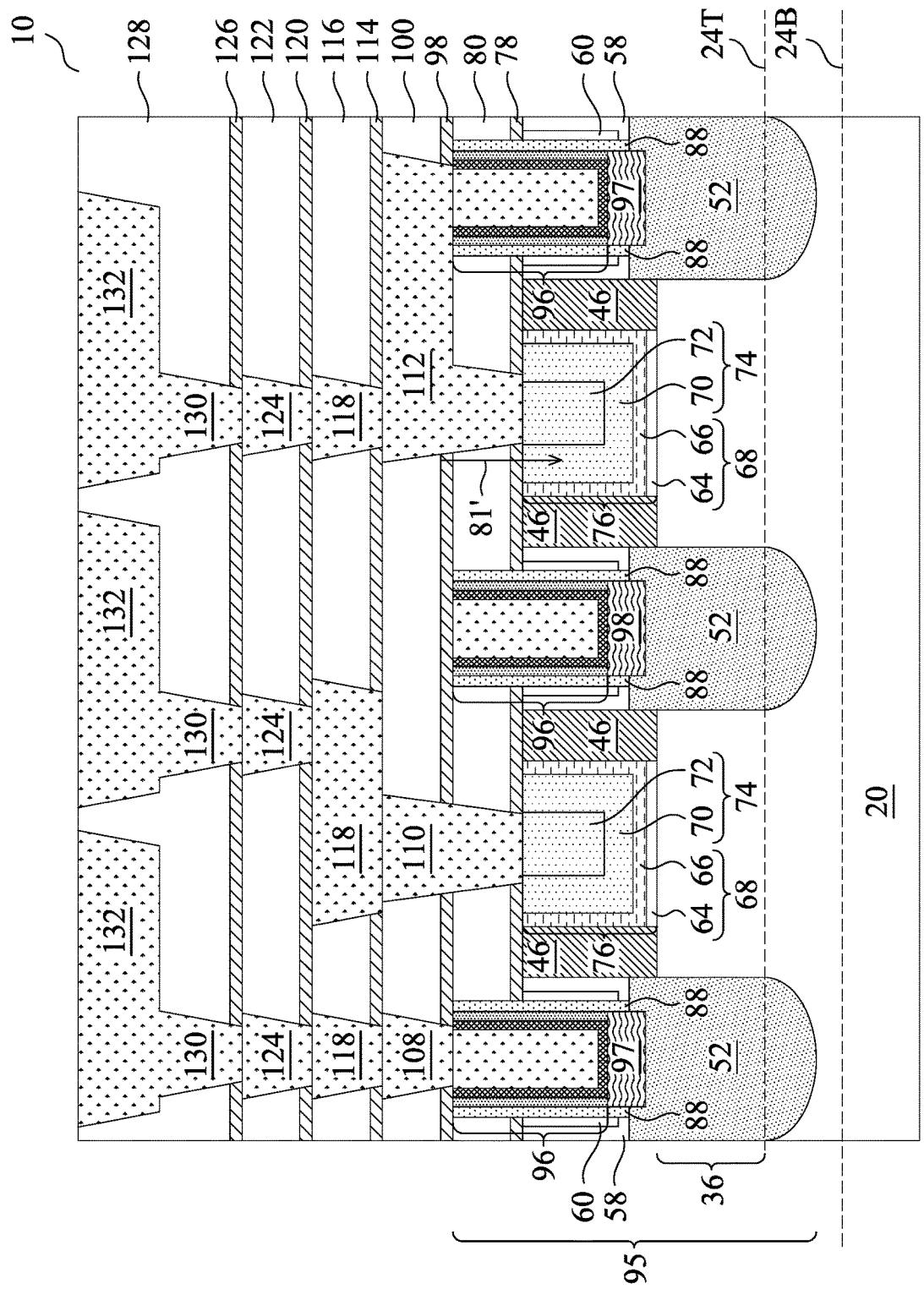

FIG. 19 illustrates the formation of etch stop layer 126, dielectric layer 128, vias 130, and metal lines 132. Etch stop layer 126 may be formed of a material similar to the material of etch stop layer 114 and/or etch stop layer 120. Dielectric layer 128 may be formed of a material similar to the material of dielectric layer 116 and/or dielectric layer 122. Vias 130 and metal lines 132 may be formed using a dual damascene process, which includes forming via openings and trenches, filling the via openings and trenches with a diffusion barrier layer and a copper-containing material, and then performing a CMP process.

Figure 20B:
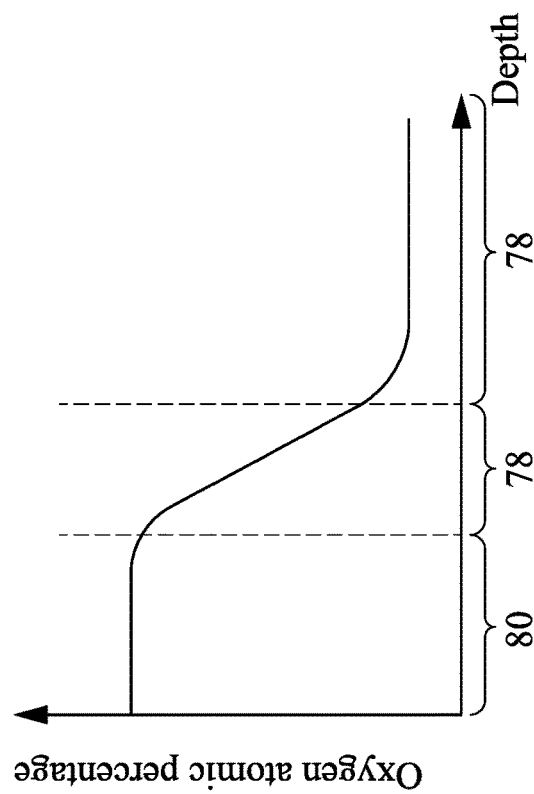
FIGS. 20A and 20B illustrate a structure and the schematic oxygen distribution, respectively, in accordance with some embodiments.
Figure 20A:
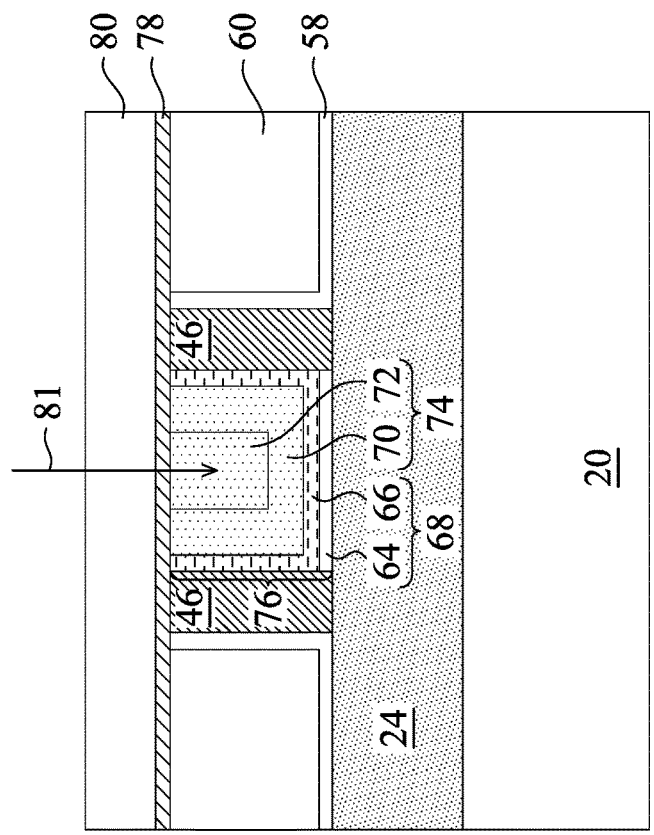

FIG. 20A illustrates a part of the structure including gate stack 76 and STI region 24. The gate stack as shown in FIG. 19 are elongated, and extends onto STI region 24, with the cross-sectional view shown in FIG. 20A illustrating a corresponding part. FIG. 20B illustrates schematic oxygen atomic percentage as a function of the depth from the top surface of ILD 80 to gate electrode 74, as shown by arrow 81. The ranges of ILD 80, capping layer 78, and gate electrode 74 are schematically illustrated. It is appreciated that capping layer 78, at the time of deposition, may be free from oxygen. After subsequent processes, which may include thermal process and/or plasma process, however, oxygen diffuses downwardly into capping layer 78 and gate electrode 74. Accordingly, in the direction of arrow 81 (FIG. 20A), the oxygen atomic percentage reduces as shown in FIG. 20B. It is appreciated that the oxygen distribution profile as shown in FIG. 20B may also be obtained along arrow 81' as shown in FIG. 19 in accordance with some embodiments.

Figure 21:
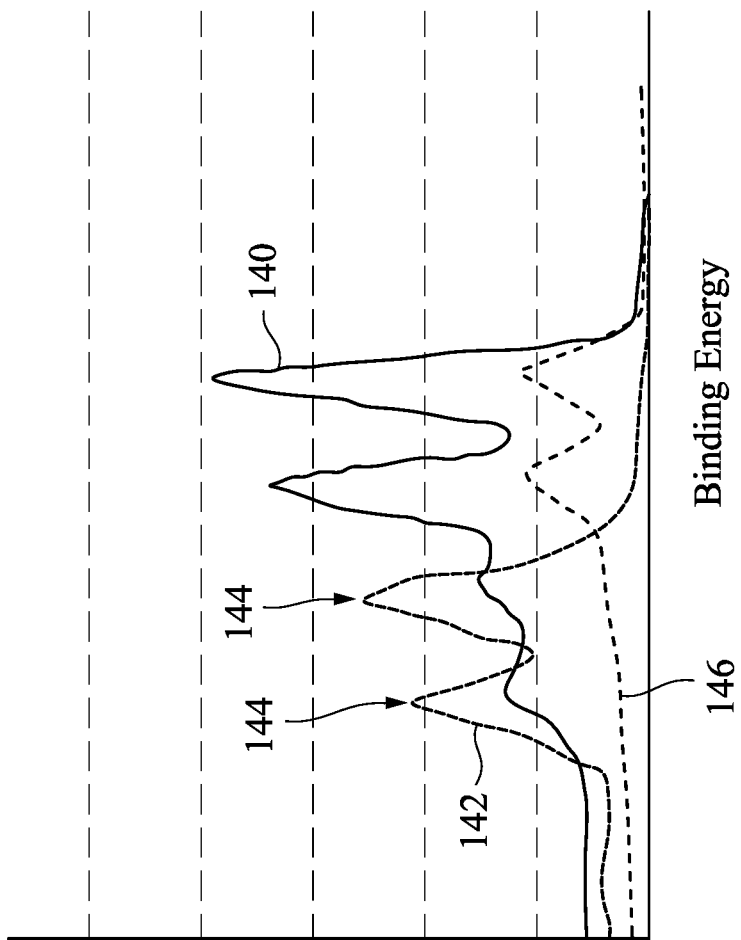
FIG. 21 illustrates the comparison of X-ray photoelectron spectroscopy results of samples with and without capping layers in accordance with some embodiments.

FIG. 21 illustrates the X-ray Photoelectron Spectroscopy (XPS) spectrum of several samples having different structures. Line 140 is the spectrum of tungsten as deposited (without going through thermal process), which is used in gate electrodes. Line 142 is the spectrum of a surface portion of the deposited tungsten after a treatment using $N_2O$, which simulates the results of oxygen diffusion from ILD into the underlying metal gate electrode under the influence of plasma deposition of ILD. Two peaks 144, which are the peaks of tungsten oxide, are found. Line 146 is the XPS spectrum of the top portion of the gate electrode with the corresponding sample including a SiN capping layer, with a $N_2O$ treatment performed after the SiN capping layer is deposited. It is observed that in line 146, the tungsten oxide peaks no long exist, indicating that the SiN capping layer is effective in preventing the oxidation of metal gate electrode.

A plurality of samples are also formed to determine the effect of the dielectric capping layer 78 on the threshold voltages of the respective transistors. The samples include n-type FinFETs and p-type FinFETs. The samples include reference n-type FinFETs and p-type FinFETs, in which no capping layer is formed, and ILDs 80 are in direct contact with the respective underlying metal gate electrodes 74, and hence metal oxide is formed, as demonstrate by FIG. 21. The threshold voltages of the reference n-type FinFETs and p-type FinFETs are hereinafter referred to as reference n-type threshold voltage and reference p-type threshold voltage, respectively. Experiment results revealed that when 2 nm and 3 nm SiN capping layers are formed, the threshold voltages of the resulting sample n-type FinFETs are reduced compared to the reference n-type threshold voltage by 67 mV and 18 mV, respectively, indicating the capping layer may significantly improve the threshold voltages of n-type FinFETs. Experiment results also revealed that when 2 nm and 3 nm capping layers are formed, the threshold voltages of the resulting p-type FinFETs are increased compared to the reference p-type threshold voltage by 11 mV and 5 mV, respectively, indicating the capping layer may also significantly improve the threshold voltages of p-type FinFETs. The results also indicated that 2 nm capping layer and 3 nm capping layers may both improve the respective FinFETs, with the 3 nm capping layer leading to significantly better results than the 2 nm capping layer. The above-discussed results are obtained from short-channel FinFETs. Sample long channel FinFETs are also formed, and the results are similar to what are obtained from short-channel FinFETs.

The embodiments of the present disclosure have some advantageous features. By forming a capping layer, which has the ability of blocking oxygen from diffusing to metal gate electrodes, the oxidation of the metal gate electrodes is reduced. The adverse shifting of threshold voltage caused by the oxidation of the metal gate electrodes is eliminated or at least reduced.

In accordance with some embodiments of the present disclosure, a method comprises forming a dummy gate stack on a semiconductor fin; forming gate spacers on sidewalls of the dummy gate stack; forming a first inter-layer dielectric, with the gate spacers and the dummy gate stack being in the first inter-layer dielectric; removing the dummy gate stack to form a trench between the gate spacers; forming a replacement gate stack in the trench; depositing a dielectric capping layer, wherein a bottom surface of the dielectric capping layer contacts a first top surface of the replacement gate stack and a second top surface of the first inter-layer dielectric; depositing a second inter-layer dielectric over the dielectric capping layer; and forming a source/drain contact plug extending into the second inter-layer dielectric, the dielectric capping layer, and the first inter-layer dielectric. In an embodiment, the forming the source/drain contact plug comprises performing a first etching process to etch the second inter-layer dielectric, the dielectric capping layer, and the first inter-layer dielectric to form a contact opening, wherein the second inter-layer dielectric, the dielectric capping layer, and the first inter-layer dielectric are etched using a same process gas. In an embodiment, the same process gas comprises a first etching gas for etching the second inter-layer dielectric and the first inter-layer dielectric, and a second etching gas for etching the dielectric capping layer. In an embodiment, the method further comprises, before the first inter-layer dielectric is formed, depositing a contact etch stop layer, wherein the contact etch stop layer contacts a source/drain region on a side of the replacement gate stack, and wherein the first etching process is stopped on the contact etch stop layer. In an embodiment, the first etching process is not stopped on the dielectric capping layer and the first inter-layer dielectric. In an embodiment, the method further comprises etching the second inter-layer dielectric and the dielectric capping layer to form a gate contact opening, wherein the second inter-layer dielectric and the dielectric capping layer are etched in a continuous etching process using a same process gas; and forming a gate contact plug filling the gate contact opening. In an embodiment, the forming the dielectric capping layer comprises depositing a non-oxygen-containing dielectric layer, and the depositing the second inter-layer dielectric comprises depositing an oxygen-containing dielectric layer. In an embodiment, the forming the dielectric capping layer comprises depositing silicon nitride. In an embodiment, the forming the dielectric capping layer comprises depositing silicon carbide. In an embodiment, the dielectric capping layer has a thickness in a range between about 3 nm and about 5 nm. In an embodiment, the depositing the dielectric capping layer is performed using atomic layer deposition. In an embodiment, the forming the replacement gate stack comprises depositing a gate dielectric layer and stacked conductive layers into the trench; and performing a planarization process to remove excess portions of the gate dielectric layer and the stacked conductive layers, wherein the dielectric capping layer is deposited on the planarized top surface of the stacked conductive layers.

In accordance with some embodiments of the present disclosure, a method comprises forming a metal gate in a first ILD; performing a planarization process to level a first top surface of the metal gate with a second top surface of the first ILD; depositing a dielectric capping layer, wherein the dielectric capping layer is over and in contact with both of the first top surface and the second top surface; depositing a second ILD over the dielectric capping layer; and in an etching process, etching both of the second ILD and the dielectric capping layer to form a contact opening, wherein the contact opening penetrates through both of the second ILD and the dielectric capping layer. In an embodiment, the second ILD and the dielectric capping layer are etched using a same etching gas. In an embodiment, the same etching gas comprises a first etching gas for etching the second ILD, and a second etching gas for etching the dielectric capping layer. In an embodiment, the etching process is performed continuously without being stopped on the dielectric capping layer. In an embodiment, the etching process is performed until the metal gate is revealed. In an embodiment, the contact opening further penetrates through the first ILD, and the etching process is stopped on a contact etch stop layer under the first ILD, and the method further comprises, in an additional etching process, etching-through the contact etch stop layer to reveal a source/drain region on a side of the metal gate.

In accordance with some embodiments of the present disclosure, a method comprises forming a metal gate in a first ILD; depositing a dielectric capping layer, wherein the dielectric capping layer is planar, and is over and in contact with both of the metal gate and the first ILD; depositing a second ILD over and in contact with the dielectric capping layer, wherein both of the first ILD and the second ILD are thicker than the dielectric capping layer; etching both of the second ILD and the dielectric capping layer to form a contact opening, wherein the etching is continuously performed until a top surface of an underlying feature is revealed; and forming a contact plug extending into the contact opening. In an embodiment, the underlying feature comprises the metal gate, and the etching is stopped on the metal gate.

In accordance with some embodiments of the present disclosure, a device comprises a semiconductor region; a gate stack over the semiconductor region, wherein the gate stack comprises a gate electrode; a gate spacer on a sidewall of the gate stack; a first inter-layer dielectric, wherein the gate stack and the gate spacer are in the first inter-layer dielectric; a dielectric capping layer comprising a bottom surface in contact with top surfaces of the gate electrode, the gate spacer, and the first inter-layer dielectric; and a second inter-layer dielectric over the dielectric capping layer. In an embodiment, the device further comprises a source/drain contact plug continuously extending into the second inter-layer dielectric, the dielectric capping layer, and the first inter-layer dielectric. In an embodiment, in a region directly over the gate stack, an oxygen atomic percentage in the dielectric capping layer continuously reduce from a top surface to the bottom surface of the dielectric capping layer. In an embodiment, the second inter-layer dielectric has a first oxygen atomic percentage equal to a second oxygen atomic percentage of a top portion of the dielectric capping layer.

In accordance with some embodiments of the present disclosure, a device comprises a semiconductor region; a gate stack over the semiconductor region; a first gate spacer and a second gate spacer contacting opposing sidewalls of the gate stack; a first inter-layer dielectric on opposing sides of the gate stack; a dielectric capping layer contacting the gate stack, wherein the dielectric capping layer further extends into regions directly over the first inter-layer dielectric; and a second inter-layer dielectric over and in physical contact with the dielectric capping layer, wherein the dielectric capping layer has a lower oxygen atomic percentage than the second inter-layer dielectric. In an embodiment, the dielectric capping layer comprises silicon nitride, and an oxygen atomic percentage in the dielectric capping layer continuously reduce from a top surface to a bottom surface of the dielectric capping layer. In an embodiment, the device further comprises a source/drain contact plug continuously extending into the second inter-layer dielectric, the dielectric capping layer, and the first inter-layer dielectric. In an embodiment, the dielectric capping layer comprises silicon carbide, and an oxygen atomic percentage in the dielectric capping layer continuously reduce from a top surface to a bottom surface of the dielectric capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a dummy gate stack on a semiconductor fin;
    forming gate spacers on sidewalls of the dummy gate stack;
    forming a first inter-layer dielectric, with the gate spacers and the dummy gate stack being in the first inter-layer dielectric;
    removing the dummy gate stack to form a trench between the gate spacers;
    forming a replacement gate stack in the trench;
    depositing a dielectric capping layer, wherein a bottom surface of the dielectric capping layer contacts a first top surface of the replacement gate stack and a second top surface of the first inter-layer dielectric;
    depositing a second inter-layer dielectric over the dielectric capping layer;
    performing a first etching process to etch the second inter-layer dielectric and the dielectric capping layer to form a contact opening, wherein the second inter-layer dielectric and the dielectric capping layer are etched using a same process gas, and wherein the same process gas comprises:
        a first etching gas, wherein the second inter-layer dielectric is etched faster than the dielectric capping layer by the first etching gas; and
        a second etching gas, wherein the dielectric capping layer is etched faster than the second inter-layer dielectric by the second etching gas; and
    filling the contact opening with a conductive material to form a contact plug.

2. The method of claim 1 further comprising:
    before the first inter-layer dielectric is formed, depositing a contact etch stop layer, wherein the contact etch stop layer contacts a source/drain region on a side of the replacement gate stack.

3. The method of claim 1, wherein the first etching process is a continuous etching process that continuously etches the second inter-layer dielectric and the dielectric capping layer.

4. The method of claim 1 further comprising:
    forming an etch stop layer over the second inter-layer dielectric;
    forming a third inter-layer dielectric over the etch stop layer; and
    etching the third inter-layer dielectric and the etch stop layer to form a source/drain contact opening, wherein the etching the third inter-layer dielectric is stopped on the etch stop layer.

5. The method of claim 1, wherein the forming the dielectric capping layer comprises depositing a non-oxygen-containing dielectric layer, and the depositing the second inter-layer dielectric comprises depositing an oxygen-containing dielectric layer.

6. The method of claim 5, wherein the forming the dielectric capping layer comprises depositing silicon nitride.

7. The method of claim 1, wherein the forming the dielectric capping layer comprises depositing silicon carbide.

8. The method of claim 1, wherein the dielectric capping layer has a thickness in a range between about 3 nm and about 5 nm.

9. The method of claim 1, wherein the depositing the dielectric capping layer is performed using a process selected from atomic layer deposition, chemical vapor deposition, and physical vapor deposition.

10. The method of claim 1, wherein the forming the replacement gate stack comprises:
    depositing a gate dielectric layer and stacked conductive layers into the trench; and
    performing a planarization process to remove excess portions of the gate dielectric layer and the stacked conductive layers, wherein the dielectric capping layer is deposited on a planarized top surface of the stacked conductive layers.

11. A method comprising:
    forming a dummy gate stack on a semiconductor fin;
    forming gate spacers on sidewalls of the dummy gate stack;
    forming a first inter-layer dielectric, with the gate spacers and the dummy gate stack being in the first inter-layer dielectric;
    removing the dummy gate stack to form a trench between the gate spacers;
    forming a replacement gate stack in the trench;
    depositing a dielectric capping layer, wherein a bottom surface of the dielectric capping layer contacts a first top surface of the replacement gate stack and a second top surface of the first inter-layer dielectric;

depositing a second inter-layer dielectric over the dielectric capping layer;

performing a first etching process to etch the second inter-layer dielectric and the dielectric capping layer to form a contact opening, wherein the first etching process is a continuous etching process that continuously etches the second inter-layer dielectric and the dielectric capping layer, wherein the second inter-layer dielectric and the dielectric capping layer are etched using a same process gas, and wherein the same process gas comprises:

a first etching gas, wherein the second inter-layer dielectric is etched faster than the dielectric capping layer by the first etching gas; and a second etching gas, wherein the dielectric capping layer is etched faster than the second inter-layer dielectric by the second etching gas; and filling the contact opening with a conductive material to form a contact plug.

12. The method of claim 11 further comprising:

before the first inter-layer dielectric is formed, depositing a contact etch stop layer, wherein the contact etch stop layer contacts a source/drain region on a side of the replacement gate stack.

13. The method of claim 11 further comprising:

forming an etch stop layer over the second inter-layer dielectric;

forming a third inter-layer dielectric over the etch stop layer; and etching the third inter-layer dielectric and the etch stop layer to form a source/drain contact opening, wherein the etching the third inter-layer dielectric is stopped on the etch stop layer.

14. The method of claim 11, wherein the forming the dielectric capping layer comprises depositing a non-oxygen-containing dielectric layer, and the depositing the second inter-layer dielectric comprises depositing an oxygen-containing dielectric layer.

15. The method of claim 14, wherein the forming the dielectric capping layer comprises depositing silicon nitride.

16. The method of claim 14, wherein the forming the dielectric capping layer comprises depositing silicon carbide.

17. A method comprising:

forming a dummy gate stack on a semiconductor fin;

forming gate spacers on sidewalls of the dummy gate stack;

depositing a contact etch stop layer, wherein the contact etch stop layer contacts a source/drain region on a side of the dummy gate stack;

forming a first inter-layer dielectric on the contact etch stop layer, with the gate spacers and the dummy gate stack being in the first inter-layer dielectric;

removing the dummy gate stack to form a trench between the gate spacers;

forming a replacement gate stack in the trench;

depositing a dielectric capping layer, wherein a bottom surface of the dielectric capping layer contacts a first top surface of the replacement gate stack and a second top surface of the first inter-layer dielectric;

depositing a second inter-layer dielectric over the dielectric capping layer;

performing a first etching process to etch the second inter-layer dielectric and the dielectric capping layer to form a contact opening, wherein the second inter-layer dielectric and the dielectric capping layer are etched using a same process gas, and wherein the same process gas comprises:

a first etching gas, wherein the second inter-layer dielectric is etched faster than the dielectric capping layer by the first etching gas; and a second etching gas, wherein the dielectric capping layer is etched faster than the second inter-layer dielectric by the second etching gas; and filling the contact opening with a conductive material to form a contact plug.

18. The method of claim 17, wherein the first etching process is a continuous etching process that continuously etches the second inter-layer dielectric and the dielectric capping layer.

19. The method of claim 17, wherein the forming the dielectric capping layer comprises depositing a non-oxygen-containing dielectric layer, and the depositing the second inter-layer dielectric comprises depositing an oxygen-containing dielectric layer.

20. The method of claim 19, wherein the forming the dielectric capping layer comprises depositing silicon nitride or silicon carbide.

* * * * *